(12) United States Patent
Imoto et al.

(10) Patent No.: US 7,525,106 B2
(45) Date of Patent: Apr. 28, 2009

(54) EXPOSURE APPARATUS, PRESSURE CONTROL METHOD FOR THE SAME, AND DEVICE MANUFACTURING METHOD

(75) Inventors: Kouhei Imoto, Utsunomiya (JP); Shigeyuki Uzawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 247 days.

(21) Appl. No.: 11/684,953

(22) Filed: Mar. 12, 2007

(65) Prior Publication Data
US 2008/0073571 A1 Mar. 27, 2008

(30) Foreign Application Priority Data
Mar. 14, 2006 (JP) ............. 2006-069901

(51) Int. Cl.
*H01J 61/24* (2006.01)
*H01J 37/301* (2006.01)

(52) U.S. Cl. ............. 250/492.2; 250/492.1; 250/372; 250/504 R; 250/365

(58) Field of Classification Search ............. 250/492.1, 250/492.2, 372, 504 R, 365
See application file for complete search history.

(56) References Cited
U.S. PATENT DOCUMENTS

| | | | |
|---|---|---|---|
| 6,855,929 B2 * | 2/2005 | Kimba et al. ............. 250/310 |
| 6,859,259 B2 | 2/2005 | Bakker et al. |
| 7,088,424 B2 | 8/2006 | Bakker et al. |
| 7,109,483 B2 * | 9/2006 | Nakasuji et al. ............. 250/310 |
| 2003/0020888 A1 | 1/2003 | Tanaka et al. |
| 2005/0030504 A1 | 2/2005 | Terashima et al. |

FOREIGN PATENT DOCUMENTS

| | | |
|---|---|---|
| JP | 2005-057154 | 3/2005 |
| KR | 2001-0023314 A | 3/2001 |
| KR | 2004-0030255 A | 4/2004 |

OTHER PUBLICATIONS

Office Action dated Mar. 28, 2008, concerning Korean Patent Application No. 10-2007-0024881.

* cited by examiner

*Primary Examiner*—Nikita Wells
(74) *Attorney, Agent, or Firm*—Morgan & Finnegan LLP

(57) ABSTRACT

An exposure apparatus exposes a substrate in a vacuum atmosphere through an optical system. The apparatus includes a partition which separates a first space including at least part of the optical system from a second space adjacent to it, and includes an opening to pass light through it. The apparatus further includes a first pressure regulator which regulates the pressure in the first space, a second pressure regulator which regulates the pressure in the second space, and a controller which outputs manipulated variables for the first and second pressure regulators. The controller outputs the manipulated variables for the first and second pressure regulators to change the pressure in the first space and the pressure in the second space in the range of a vacuum to the atmospheric pressure while maintaining a pressure relationship in which the pressure in the first space is higher than that in the second space.

17 Claims, 16 Drawing Sheets

F I G. 10
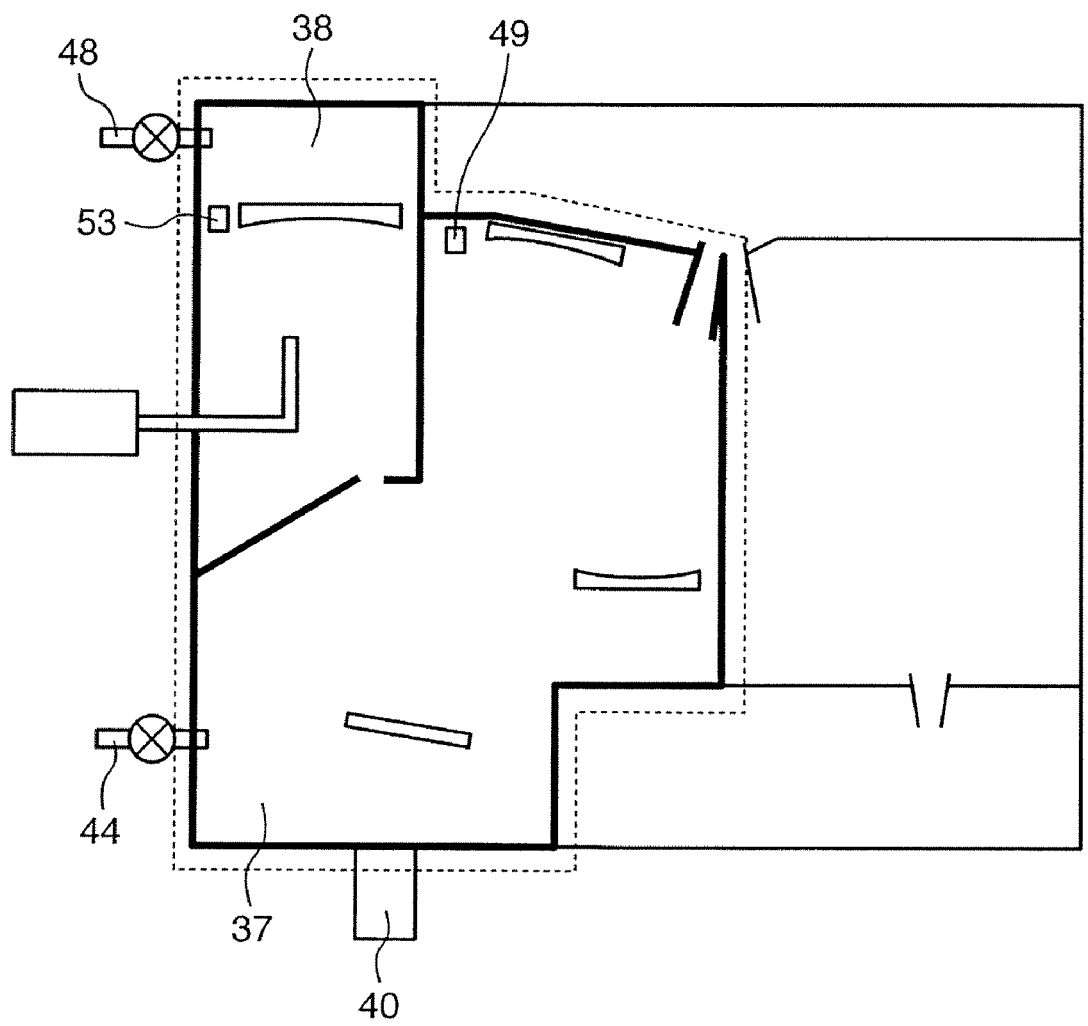

EXPOSURE APPARATUS, PRESSURE CONTROL METHOD FOR THE SAME, AND DEVICE MANUFACTURING METHOD

BACKGROUND OF THE INVENTION

1. Field of the Invention

The present invention relates to an exposure apparatus, a pressure control method for the same, and a device manufacturing method.

2. Description of the Related Art

The manufacture of a fine semiconductor element such as a semiconductor memory or logic circuit by the photolithography technique employs a reduction projection exposure apparatus. The reduction projection exposure apparatus projects and transfers a circuit pattern formed on a reticle (or a mask) onto a wafer or the like by a projection optical system.

The minimum dimension (resolution) that the reduction projection exposure apparatus can transfer is proportional to the wavelength of light used for exposure and inversely proportional to the numerical aperture (NA) of the projection optical system. The shorter the wavelength, the higher the resolution. Hence, along with the recent demand for further micropatterning of the semiconductor element, the wavelength of exposure light has been decreasing. More specifically, the wavelength of the exposure light has been decreasing to an ultrahigh-pressure mercury lamp (i-line (with a wavelength of about 365 nm)), a KrF excimer laser (with a wavelength of about 248 nm), and an ArF excimer laser (with a wavelength of about 193 nm) in this order.

The feature size of semiconductor elements is shrinking rapidly, while the photolithography technique using ultraviolet-range exposure light as described above has its limitations. To transfer a very fine circuit pattern of 0.1 µm or less efficiently, a reduction projection exposure apparatus (to be referred to as an "EUV exposure apparatus" hereinafter) using extreme ultraviolet (EUV) light having a wavelength of about 10 nm to 15 nm, shorter than that of ultraviolet light, has been developed.

As an EUV light source in the EUV exposure apparatus, for example, a laser plasma source is used. The laser plasma source irradiates a target member placed in a vacuum chamber with a high-intensity pulse laser beam to generate a high-temperature plasma. The EUV light with a wavelength of about, e.g., 13 nm, which is emitted by the plasma is used as the exposure light. As the target member, a thin metal film, an inert gas, a droplet, or the like is used. The target member is supplied into the vacuum chamber by a mechanism such as a gas jet. To increase the average intensity of the EUV light emitted from the target, the higher the repetition frequency of the pulse laser, the better. Usually, the pulse laser is operated with a repetition frequency of several kHz.

In the wavelength region of the EUV light, light absorption by a substance is very large. A refractive optical system utilizing inflection of light, which is used with visible light or ultraviolet light, is not practical, because its EUV light transmittance with respect to an optical element such as a lens is low, and accordingly a reflective optical system is used. As the reticle, a reflective reticle is used, on which a pattern to be transferred is formed by an absorbent arranged on a mirror.

EUV light is largely absorbed by gases. For example, assume an environment where molecules containing carbon such as hydrocarbon remain in a region filled with 10-Pa air. In this environment, light irradiation causes carbon to gradually attach to the surface of an optical member. Carbon absorbs EUV light to decrease the reflectance of the optical member. To prevent carbon from attaching to the surface of the optical member, the region where the optical member to be irradiated with EUV light is arranged must be maintained at a pressure of at least $10^{-4}$ Pa or less and preferably $10^{-6}$ Pa or less.

In the exposure apparatus, the operation of loading a wafer coated with a resist as a photosensitive agent into the exposure apparatus from the outside and unloading the wafer after transferring the circuit pattern of the reticle to the wafer repeats. A wafer stage has driving mechanisms such as a moving mechanism for scanning and exposure and a transport mechanism which transports the wafer, and accordingly has a very large surface area. These mechanisms generate gases. It is, therefore, very difficult to maintain a wafer stage space within such a low pressure range as mentioned previously.

Furthermore, the resist applied on the wafer is an organic substance, although it is heated and baked before exposure. Thus, when the resist is loaded into the vacuum, the organic substance that forms the resist, a carbon compound resulting from the organic substance by decomposition, and the like vaporize. The vaporized substance diffuses in the exposure apparatus maintained at the vacuum. As the wafer is loaded into the exposure apparatus from the outside, it is difficult to remove air components such as moisture attaching to the wafer within a short period of time before loading the wafer, and the air components are released gradually in the vacuum. Such gases (to be referred to as an outgas hereinafter) emitted from the wafer, the resist, and the constituent components of the exposure apparatus cause contaminants such as carbon to attach to the surface of the optical member. Then, the optical member cannot obtain desired optical characteristics. It may be possible to enhance the vacuum state by using a large-capacity exhaust pump or the like. In this case, carbon-containing molecules or moisture must be prevented from scattering in the exposure apparatus, particularly to the region where the mirror or reticle, the reflectance of which may decrease as carbide attaches, is arranged.

In view of this, a partition may be provided between the wafer stage space and the projection optical system space. An opening may be formed in only a portion of the partition corresponding to the light path where EUV light for exposure passes, to prevent diffusion of the outgas from the wafer stage space into a projection optical system space. Similarly, a partition having an opening in only a light path can be provided between the projection optical system space and a reticle stage space, and between the reticle stage space and an illumination optical system space. To suppress diffusion of the outgas, the opening that connects the two spaces must be formed in the vicinity of the wafer where the EUV light focuses, and also be as small as possible.

Merely forming an opening in the partition may not sufficiently allow the opening to have a desired conductance. A wall having a sufficiently thick opening so as not to block the EUV light path can be set. If the thickness of the opening part is variable, the conductance can be regulated to suit the situation. As the mirror of the projection optical system suppresses optical aberration, the EUV light desirably enters the mirror almost perpendicularly. The mirror that constitutes the optical system also must be arranged close to the wafer or reticle, further adding limitations on the shape of the opening.

To prevent diffusion of the outgas to the projection optical system space, a high-purity inert gas may be supplied. This increases the pressure in the projection optical system space to be higher than that in the wafer stage space, thereby preventing diffusion and inflow of the outgas (see Japanese Patent Laid-Open No. 2005-57154 corresponding to US Publication No. 2005-0030504 A1). As the inert gas, high-purity helium gas, high-purity nitrogen gas, or the like is used.

Supply of high-purity helium does not largely attenuate the EUV light in light path space from the light source to the wafer. When compared to a case wherein the entire light path space is maintained at a high vacuum, the attenuation merely changes by as little as several % or less.

When using a gas plasma source as the light source, a filter that selectively transmits only EUV light can be used in the light path, so the gas components of the source will not influence the illumination optical system. As the filter, for example, a Zr filter may be used. The transmittance, however, is about 50% with a 0.5-mm thick filter, and decreases greatly.

In the exposure apparatus, when performing periodic maintenance or parts exchange, vacuum in the space must be broken, and the space must be opened to the atmosphere. In a general vacuum device, when breaking vacuum in the space, the space to break vacuum and the space not to break vacuum are disconnected. An inert gas or dry air is supplied into the space, and the space is pressurized until reaching the atmospheric pressure, thus opening the space to the atmosphere. In the EUV exposure apparatus, however, as the opening and mirror are arranged in the vicinity of the wafer or reticle, it is difficult to provide a mechanism to close the opening. For this reason, when the space is opened to the atmosphere, the wafer stage space communicates with the projection optical system space through the opening, and the gas may shift between the two spaces. In breaking vacuum in a case wherein spaces with different vacuum degrees and outgas amounts coexist through an opening, as in the EUV exposure apparatus, the following problems arise in accordance with the initial pressures in the respective spaces.

(1) When the projection optical system space is maintained at a high vacuum and the wafer stage space has a pressure higher than that in the projection optical system space during exposure, if vacuum of the exposure apparatus is broken, the outgas diffuses and flows to the low-pressure projection optical system space.

(2) When an inert gas is supplied to the projection optical system space during exposure so the projection optical system space has a pressure higher than that in the wafer stage space, when vacuum is broken, the pressure gradient between the projection optical system space and wafer stage system cannot be maintained, as shown in FIG. 13. Then, the outgas may diffuse and flow to the projection optical system space.

If these problems occur, the outgas substance attaches to the surface of the optical element, and desired optical characteristics cannot be obtained. If the outgas diffused in the projection optical system space, degassing from the projection optical system space during re-evacuation takes time to decrease the evacuation efficiency. Such decrease in evacuation efficiency leads to an increase in downtime of the apparatus.

As described above, in the EUV exposure apparatus, an opening formed in the partition between the space where the outgas amount is little and the space where the outgas amount is large makes isolation of the two spaces incomplete. Consequently, the outgas can diffuse from the space where the wafer stage and reticle stage are arranged and the outgas amount is accordingly large, to the space where the projection optical system is arranged or the space where the illumination optical system is arranged, causing a problem.

Hence, in the exposure apparatus having a plurality of vacuum regions which are incompletely isolated from each other, to suppress the outgas from diffusing from the space where the outgas amount is large to the space where the outgas amount is small, when breaking vacuum, is sought for.

SUMMARY OF THE INVENTION

The present invention has been made based on the recognition of the above problems, and has as its object in, e.g., an exposure apparatus, to control the shift of outgas between two spaces separated by a partition having an opening.

According to the first aspect of the present invention, there is provided an exposure apparatus which includes an optical system and exposes a substrate in a vacuum atmosphere through the optical system. The exposure apparatus comprises a partition which separates a first space including at least part of the optical system from a second space adjacent to the first space, and includes an opening to pass light therethrough, a first pressure regulator which regulates the pressure in the first space, a second pressure regulator which regulates the pressure in the second space, and a controller which outputs manipulated variables for the first pressure regulator and the second pressure regulator, wherein the controller outputs the manipulated variables for the first pressure regulator and the second pressure regulator to change the pressure in the first space and the pressure in the second space in a range of a vacuum to an atmospheric pressure while maintaining a pressure relationship in which the pressure in the first space is higher than the pressure in the second space.

According to a preferred embodiment of the present invention, the controller can be configured to increase the pressure in the first space to satisfy the pressure relationship, and thereafter output the manipulated variables for the first pressure regulator and the second pressure regulator to change the pressure in the first space and the pressure in the second space from the vacuum to the atmospheric pressure while maintaining the pressure relationship.

According to another preferred embodiment of the present invention, the controller can be configured to output the manipulated variables for the first pressure regulator and the second pressure regulator to change the pressure in the first space and the pressure in the second space from the atmospheric pressure to the vacuum while maintaining the pressure relationship.

According to still another preferred embodiment of the present invention, the controller can be configured to output the manipulated variables for the first pressure regulator and the second pressure regulator, after the pressure in the first space and the pressure in the second space decrease to preset pressures, to satisfy a pressure relationship in which the pressure in the first space is lower than the pressure in the second space.

According to still another preferred embodiment of the present invention, each of the preset pressures can comprise a pressure not higher than a rarefied gas critical pressure.

According to still another preferred embodiment of the present invention, each of the first pressure regulator and the second pressure regulator can include a gas exhaust system and a gas supply system.

According to still another preferred embodiment of the present invention, each of the first pressure regulator and the second pressure regulator can further include a pressure sensor.

According to still another preferred embodiment of the present invention, the optical system can include at least one of a projection optical system to project a pattern of an original plate onto the substrate and an illumination optical system to illuminate the original plate.

According to still another preferred embodiment of the present invention, the exposure apparatus can further comprise any one of an original plate stage mechanism arranged in the second space to move an original plate, a substrate stage mechanism arranged in the second space to move the substrate, and a light source arranged in the second space.

The second aspect of the present invention relates to a pressure control method to be applied to an exposure apparatus. The exposure apparatus includes an optical system and a partition that separates a first space including at least part of the optical system from a second space adjacent to the first space, and an opening to pass light therethrough, and exposes a substrate in a vacuum atmosphere through the optical system. The pressure control method comprises measuring a pressure in the first space and a pressure in the second space, and changing the pressure in the first space and the pressure in the second space in a range of a vacuum to an atmospheric pressure on the basis of a measurement while maintaining a pressure relationship in which the pressure in the first space is higher than the pressure in the second space.

According to a preferred embodiment of the present invention, the above pressure control method can increase the pressure in the first space to satisfy the pressure relationship, and thereafter change the pressure in the first space and the pressure in the second space from the vacuum to the atmospheric pressure while maintaining the pressure relationship.

According to another preferred embodiment of the present invention, the above pressure control method can change the pressure in the first space and the pressure in the second space from the atmospheric pressure to the vacuum while maintaining the pressure relationship.

According to still another preferred embodiment of the present invention, the above pressure control method can change the pressure in the first space and the pressure in the second space, after the pressure in the first space and the pressure in the second space decrease to preset pressures, to satisfy a pressure relationship in which the pressure in the first space is lower than the pressure in the second space.

According to still another preferred embodiment of the present invention, each of the preset pressures can comprise a pressure not higher than a rarefied gas critical pressure.

According to still another preferred embodiment of the present invention, the optical system can include at least one of a projection optical system to project a pattern of an original plate onto the substrate and an illumination optical system to illuminate the original plate.

According to still another preferred embodiment of the present invention, any one of an original plate stage mechanism to move an original plate, a substrate stage mechanism to move the substrate, and a light source can be arranged in the second space.

According to the third aspect of the present invention, there is provided a device manufacturing method comprising an exposure step of exposing a substrate in a vacuum atmosphere using the exposure apparatus, a developing step of developing the exposed substrate, and a processing step of processing the developed substrate.

Further features of the present invention will be apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10 is a view showing some constituent components extracted from FIG. 14;

DESCRIPTION OF THE EMBODIMENTS

Preferred embodiments of the present invention will be described with reference to the accompanying drawings.

An exposure apparatus of the present invention can be configured to form a latent pattern on a photosensitive agent on a substrate. The exposure apparatus of the present invention has a plurality of components to form the latent pattern on the photosensitive agent on the substrate. The components can include, e.g., a projection optical system, a substrate stage mechanism, an original plate stage mechanism, an illumination optical system or light source, and the like. The exposure apparatus of the present invention has a plurality of spaces in each of which one or a plurality of components are arranged. Of the plurality of spaces, two spaces are separated by a partition having an opening. Such space is synonymous with a room or chamber, and some member separates it from another space.

The exposure apparatus of the present invention can be configured to expose a photosensitive agent applied to a substrate such as a semiconductor wafer or a glass substrate for a liquid crystal display (LCD) to form a latent pattern on the photosensitive agent. This exposure can include exposure of the photosensitive substrate through an original plate pattern, or drawing of a pattern on the photosensitive substrate and exposure of the photosensitive substrate.

For example, exposure light can include electromagnetic waves such as ultraviolet light, extreme ultraviolet (EUV) light, or X-rays, and radiation such as a particle beam, e.g., an electron beam. The optical system in the exposure apparatus can include not only an optical system for ultraviolet light, extreme ultraviolet light, the X-rays, or the like, but also an arrangement (a so-called electron optical system or the like) which exerts the same or similar action as that of the optical system on the particle beam such as the electron beam.

Figure 14:
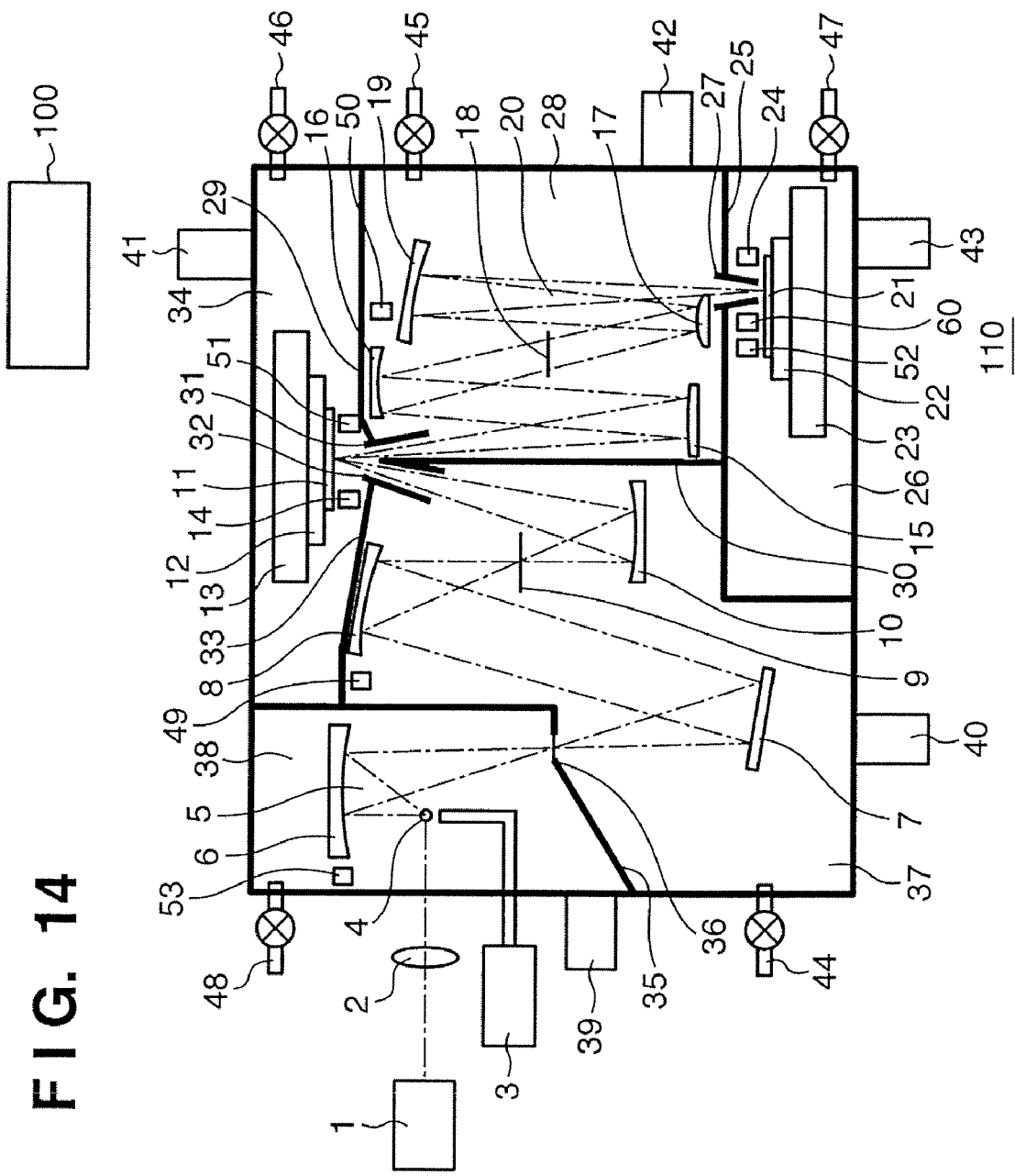
FIG. 14 is a view showing the schematic arrangement of an exposure apparatus according to the preferred embodiment of the present invention.

FIG. 14 is a view showing an example of the schematic arrangement of an exposure apparatus 110 according to the preferred embodiment of the present invention. Referring to FIG. 14, reference numeral 1 denotes an excitation pulse laser; 2, a condenser lens; 3, a target gas supply device; 4, a plasma; and 5, EUV light. Reference numeral 6 denotes an illumination system first mirror; 7, an optical integrator; 8, an illumination system second mirror; 9, a field angle limiting aperture; and 10, an illumination system third mirror. Reference numeral 11 denotes a reflective reticle; 12, a reticle check (reticle holding device); 13, a reticle stage mechanism; and 14, a reticle alignment optical system (a detector for reticle alignment).

Reference numeral 15 denotes a projection system first mirror; 16, a projection system second mirror; 17, a projection system third mirror; 18, an opening limiting aperture; and 19, a projection system fourth mirror. These mirrors 15 to 19 constitute a projection optical system. Reference numeral 20 denote projection EUV light; 21, a substrate; 22, a substrate chuck; 23, a substrate stage mechanism; and 24, a substrate alignment optical system (a detector for substrate alignment).

Reference numeral 25 denotes a partition which separates the space of the substrate stage mechanism 23 from the space of the projection optical system. Reference numeral 26 denotes a substrate stage space where the substrate stage mechanism 23 is arranged. Reference numeral 27 denotes an opening to pass the projection EUV light 20. Reference numeral 28 denotes a projection optical system space where the projection optical system is arranged. Reference numeral 29 denotes a partition which separates the projection optical system space 28 from a reticle stage space. Reference numeral 30 denotes a partition which separates the projection optical system space 28 from an illumination optical system space. Reference numeral 31 denotes an opening formed in the partition 29 to pass the EUV light reflected by the reticle 11; and 32, an opening to pass the EUV light irradiating the reticle 11.

Reference numeral 33 denotes a partition which separates the reticle stage space from the illumination optical system space; 34, a reticle stage space; 35, a partition which separates a light source space from the illumination optical system space; and 36, an opening (window) through which the EUV light from the light source side travels to the illumination system side. Reference numeral 37 denotes the illumination optical system space; and 38, the light source space.

Reference numeral 39 denotes a gas exhaust system which exhausts gas from the light source space 38; and 40, a gas exhaust system which exhausts gas from the illumination optical system space 37. Reference numeral 41 denotes a gas exhaust system which exhausts gas from the reticle stage space 34; 42, a gas exhaust system which exhausts gas from the projection optical system space 28; and 43, a gas exhaust system which exhausts gas from the substrate stage space 26.

Reference numeral 44 denotes a gas supply valve which supplies high-purity helium gas to the illumination optical system space 37; and 45, a gas supply valve which supplies high-purity helium gas to the projection optical system space 28. Reference numeral 46 denotes a gas supply valve which supplies high-purity helium gas to the reticle stage space 34; and 47, a gas supply valve which supplies high-purity nitrogen gas to the substrate stage space 26. Reference numeral 48 denotes a gas supply valve which supplies high-purity nitrogen gas to the light source space 38. Each gas supply valve, together with a gas supply line (not shown) connecting to it, constitutes a gas supply system which supplies a gas to the space.

Reference numeral 49 denotes a pressure sensor which measures the pressure in the light source space; 50, a pressure sensor which measures the pressure in the projection optical system space; and 51, a pressure sensor which measures the pressure in the reticle stage space 34. Reference numeral 52 denotes a pressure sensor which measures the pressure in the substrate stage space 26; and 53, a pressure sensor which measures the pressure in the light source space 38.

The gas exhaust system, the gas supply system, and preferably the pressure sensor described above constitute a pressure regulator. According to one example, the gas exhaust system 42, a gas supply system including the gas supply valve 45, and further preferably the pressure sensor 50 constitute one pressure regulator. According to another example, the gas exhaust system 43, a gas supply system including the gas supply valve 47, and further preferably the pressure sensor 52 constitute one pressure regulator. When the pressure regulator is configured to include a pressure sensor, the pressure in the space as the regulation target can be regulated by operating at least one of the gas exhaust system and gas supply system on the basis of the monitoring result of the pressure by the pressure sensor.

Furthermore, referring to FIG. 14, reference numeral 100 denotes a pressure controller (control unit) which outputs the manipulated variable of at least one of a group comprising the gas supply valves 44 to 49 and a group comprising the gas exhaust systems 39 to 43 to control the pressures in the spaces 26, 28, 34, 37, and 38.

The exposure apparatus 110 can be configured as an EUV exposure apparatus which exposes the substrate 21 through a circuit pattern formed on the reticle (original plate) 11 using, e.g., EUV light (having a wavelength of, e.g., 3.4 nm) as exposure illumination light. The exposure apparatus 110 can be configured as, e.g., a step-and-scan scheme or step-and-repeat scheme apparatus. The exposure apparatus 110 is suitable for a photolithography process on the submicron order, quarter micron order (e.g., 0.1 μm), or less.

According to the step-and-scan scheme, a substrate is exposed through a reticle pattern while scanning the reticle and substrate continuously. According to the step-and-repeat scheme, an exposure region is exposed at once with the reticle and substrate being set still. With either scheme, after 1-shot exposure is ended, the substrate is stepped for the next 1-shot exposure.

The exposure apparatus 110 has the light source space 38, illumination optical system space 37, reticle stage space 34, projection optical system space 28, and substrate stage space 26. Partitions that separate these spaces from each other respectively have openings at light paths where the EUV light for exposure passes. Therefore, although the respective spaces communicate with each other through the openings, their vacuum degrees and outgas amounts are controlled separately.

The light source space 38 will be described. The light source space 38 is a space where a laser plasma source generates EUV light. For example, a laser beam emitted from the excitation pulse laser 1 excites a target gas supplied from the target gas supply device 3 to generate the EUV light 5. As a gas is used as the target, the gas exhaust system 39 including a turbo pump maintains the light source space 38 at a vacuum. The pressure sensor 53 manages the vacuum degree of the light source space 38. The gas supply valve 48 which supplies the inert gas can break vacuum in the light source space 38.

The illumination optical system will be described. The partition 35 which separates the light source space 38 and illumination optical system space 37 from each other has an opening to pass the EUV light provided from the light source space 38 to the illumination optical system space 37. The gas exhaust system 40 and pressure sensor 49 maintain the illumination optical system space 37 at a high vacuum in order to prevent the outgas from contaminating the surface of an optical element.

According to this embodiment, the illumination optical system comprises three mirrors, i.e., the illumination system first mirror 6, illumination system second mirror 8, and illumination system third mirror 10. The illumination system first mirror 6 is arranged in the light source space 38. The field angle limiting aperture 9 to limit the field angle of a beam irradiating the reticle 11 is arranged between the illumination system second mirror 8 and illumination system third mirror 10. The gas supply valve 44 which supplies the inert gas can break vacuum of the illumination optical system space 37.

The reticle stage space 34 will now be described. The reticle 11 is a reflective reticle having a circuit pattern (or image) which is to be transferred onto the mirror. The reticle stage mechanism 13 supports and drives the reticle 11. Diffraction light emerging from the reticle 11 is projected onto the substrate 21 through the projection optical system. The reticle 11 and substrate 21 are arranged to be optically conjugate to each other. When the exposure apparatus 110 is configured as a step-and-scan scheme apparatus (scanner), it scans the reticle 11 and substrate 21 at a speed ratio corresponding to the reduction ratio (e.g., 4:1) of the projection optical system to transfer the pattern on the reticle 11 onto the substrate 21. When the exposure apparatus 110 is configured as a step-and-repeat scheme apparatus (stepper), it performs exposure with the reticle 11 and substrate 21 being set in a still state. The supply valve 46 which supplies the inert gas can break vacuum of the reticle stage space 34.

The reticle stage mechanism 13 supports the reticle 11 through the reticle chuck 12 and includes a driving mechanism (not shown). The reticle chuck 12 chucks the reticle 11 by, e.g., an electrostatic chucking force. The driving mechanism (not shown) comprises a linear motor or the like and can move the reticle 11 by driving the reticle stage in at least the X direction. When the exposure apparatus 110 is configured as a scanner, it scans the reticle 11 and substrate 21 in synchronism.

The projection optical system arranged in the projection optical system space 28 reduces and projects the pattern on the surface of the reticle 11 onto the substrate 21 located at the image surface using the plurality of mirrors 15 to 17 and 19. As the reflection mirrors 15 to 17 and 19, multilayer mirrors are preferably used to suppress light loss. Even by using the multilayer mirrors, the light loss is larger than reflection of the mirror of the visible light. Thus, the number of reflection mirrors 15 to 17 and 19 should be minimum and is desirably about four to six. To form a large exposure region with a small number of mirrors, desirably, the reticle 11 and substrate 21 are scanned simultaneously by using only a thin arcuate region (ring field) spaced apart from the optical axis by a predetermined distance. The reflection surfaces of the reflection mirrors 15 to 17 and 19 are convex or concave spherical or non-spherical surfaces. The supply valve 45 which supplies the inert gas can break vacuum state of the projection optical system space 28.

The substrate 21 can be, e.g., a semiconductor wafer or a glass substrate for a liquid crystal display device. The substrate 21 is coated with a photoresist (photosensitive agent). Note that a substrate coated with a photoresist will also be referred to as a photosensitive substrate.

The substrate stage mechanism 23 supports the substrate 21 through the substrate chuck 22 and includes a driving mechanism (not shown). For example, a measurement device such as a laser interferometer can monitor the positions of the substrate stage and reticle stage. When the exposure apparatus 110 is configured as a scanner, it drives the substrate stage ad reticle stage at a constant speed ratio in accordance with a measurement result obtained by the measurement device. The substrate stage mechanism 23 can be configured to include a coarse movement stage, a fine movement stage, and the like. The supply valve 47 which supplies the inert gas can break vacuum of the substrate stage space 26.

The alignment detectors 14 and 24 measure the positional relationship between the reticle 11 and the optical axis of the projection optical system space 28 and the positional relationship between the substrate 21 and the optical axis of the projection optical system space 28. The positions and angles of the reticle stage and wafer stage are set to form the projection image of the reticle 11 at a predetermined position on the substrate 21.

A focus position detector 60 measures the position of the surface of the substrate 21, i.e., the focus position in the direction of optical axis, to control the position and angle of the substrate stage. This allows the surface of the substrate 21 to always coincide with the image surface of the projection optical system during exposure.

Turbo molecular pumps capable of evacuation to a high vacuum are respectively set in the substrate stage space 26, projection optical system space 28, reticle stage space 34, illumination optical system space 37, and light source space 38. As described above, the respective spaces communicate with each other through the respective openings, so that they can be evacuated even when no gas exhaust pumps are provided in the respective spaces. If the respective spaces are not provided with dedicated gas exhaust pumps, it is difficult to evacuate all the spaces to a high vacuum due to the conductance of the openings.

To eliminate impurities in the respective spaces, the spaces must be evacuated once to as high a vacuum as possible. In particular, the projection optical system space where the optical system is arranged is designed such that factors such as a driving mechanism that can cause outgas decrease as much as possible so as to minimize the adverse influence of the outgas on the optical element. This enables evacuation to an ultrahigh vacuum range to maintain the moisture and carbon compound in the optical system space very few.

Consequently, the projection optical system space 28 can be set at a pressure lower than that in the remaining stage spaces and the like. As the pressure in the projection optical system space 28 becomes lower than that in the substrate stage space 26, however, the outgas may diffuse from the substrate stage space 26 to the projection optical system space 28. In view of this, the projection optical system space 28 may be evacuated first, and after that the valve 45 may be used to supply high-purity helium to the projection optical system space 28. The valve 45 can be used as a leak valve when breaking vacuum state of the exposure apparatus.

Similarly, high-purity helium may be supplied to the reticle stage space 34, illumination optical system space 37, and substrate stage space 26. The supply of helium decreases attenuation of the EUV light due to the gas present in the light path space from the light source to the substrate. When compared to a case wherein the entire light path space is maintained at a high vacuum, the attenuation merely changes by as small as less than several %. From the viewpoint of cost, dry air or high-purity nitrogen gas may be used in place of helium. In this case, attenuation of the EUV light in the light path space increases when compared to the case which uses helium.

When breaking vacuum in the exposure apparatus by periodic maintenance or parts exchange to open the apparatus to the atmosphere, the exhaust amount of the gas exhaust system arranged in each space is decreased, and the gas supply valve is opened to supply the inert gas. As the respective spaces communicate with each other through the openings, gas can shift between the spaces. This causes the problem of diffusion and inflow of the outgas of the substrate stage space 26 to the projection optical system space 28. Hence, when breaking vacuum, the pressures in the respective spaces are controlled to provide a pressure gradient so as to prevent diffusion and inflow of the outgas from the substrate stage space 26.

Figure 3:
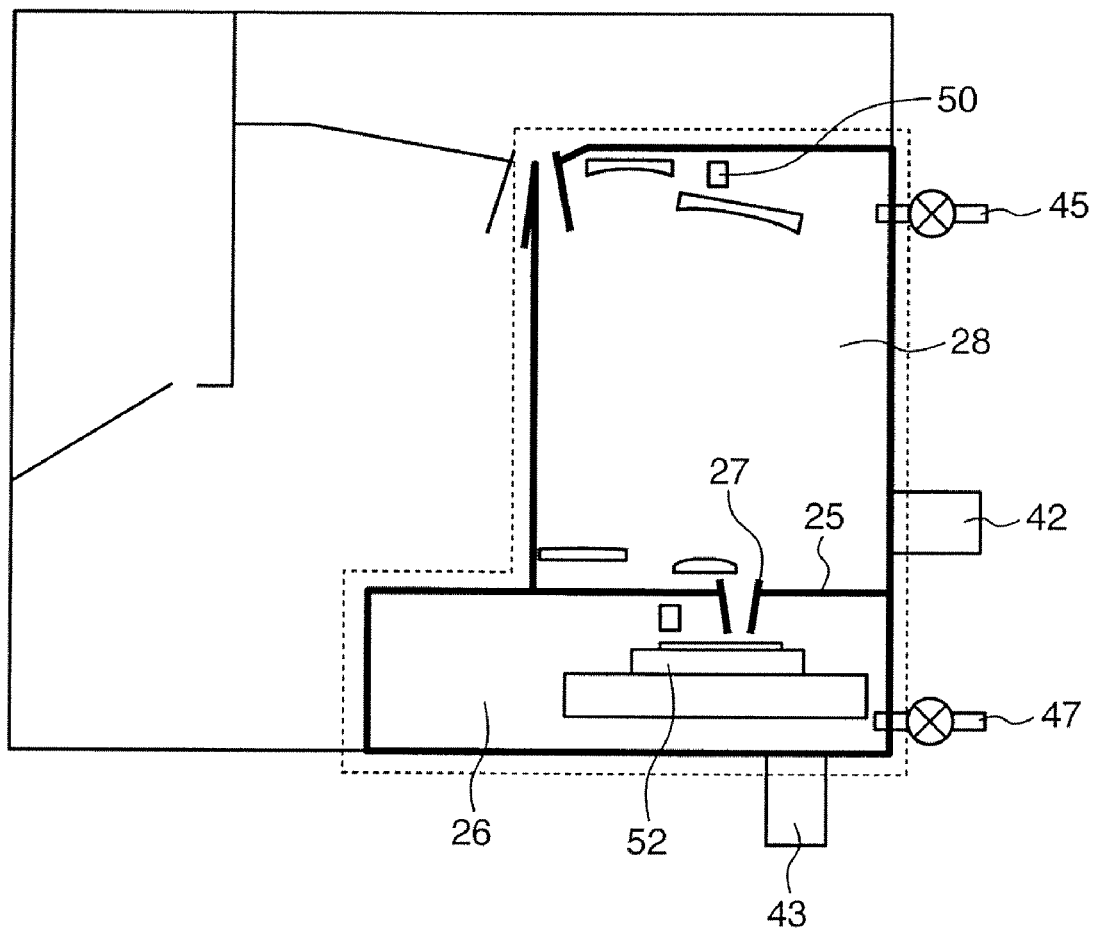
FIG. 3 is a view showing some constituent components extracted from FIG. 14.

Pressure control of the spaces 26, 28, 34, 37, and 38 by the pressure controller 100 will be described hereinafter in detail. During assembly, vacuum in the exposure apparatus can be broken for the purpose of, e.g., assembly, maintenance, or repair. Pressure control in the projection optical system space 28 and substrate stage space 26 will be described as a typical example. This is because since the outgas largely, adversely affects particularly the projection optical system space 28, diffusion of the outgas from the substrate stage space 26, which is a major cause that generates the outgas, is most problematic. In vacuum breaking, roughly the following pressure control procedures are possible. FIG. 3 is a view showing some constituent components extracted from FIG. 14 so that they can be visually recognized better.

Pressure Control 1

Figure 1:
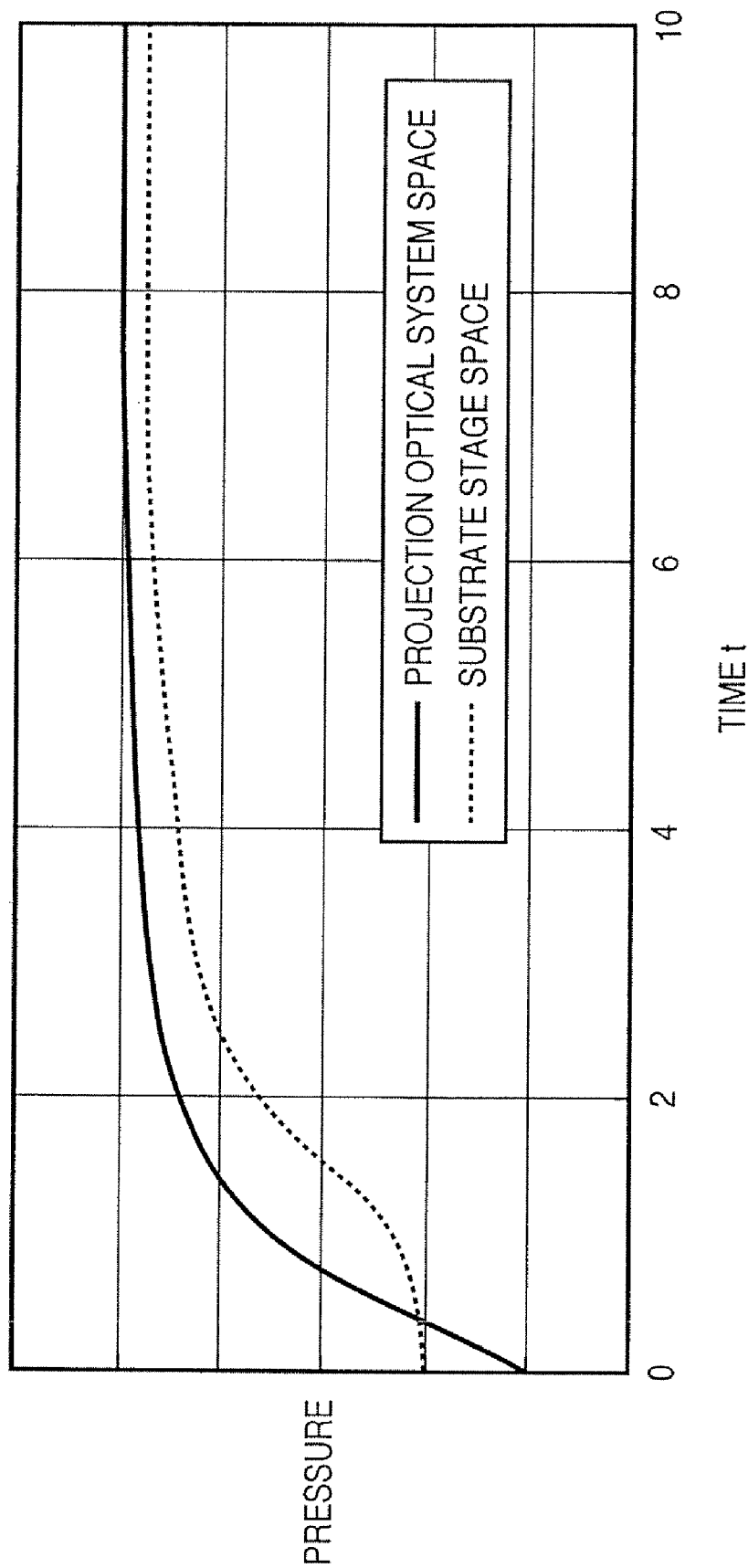
FIG. 1 is a graph showing pressure control (pressure control 1) according to a preferred embodiment of the present invention

When the projection optical system space 28 is maintained at a high vacuum and the substrate stage space 26 is maintained at a low vacuum ((the pressure in the projection optical system space)<(the pressure in the substrate stage space)), the pressure controller 100 performs pressure control shown in, e.g., FIG. 1. The projection optical system space 28 generates a relatively small amount of outgas, and the substrate stage space 26 generates a relatively large amount of gas.

More specifically, first, the pressure controller 100 pressurizes the projection optical system space 28, that should be maintained at a high purity, to have a pressure higher than that in the projection optical system space 28 (preparatory pressurization procedure). Subsequently, the pressure controller 100 pressurizes the projection optical system space 28 and substrate stage space 26 to the atmospheric pressure while maintaining a relationship in which the pressure in the former is higher than that in the latter (pressurization procedure).

Pressure Control 2

Figure 2:
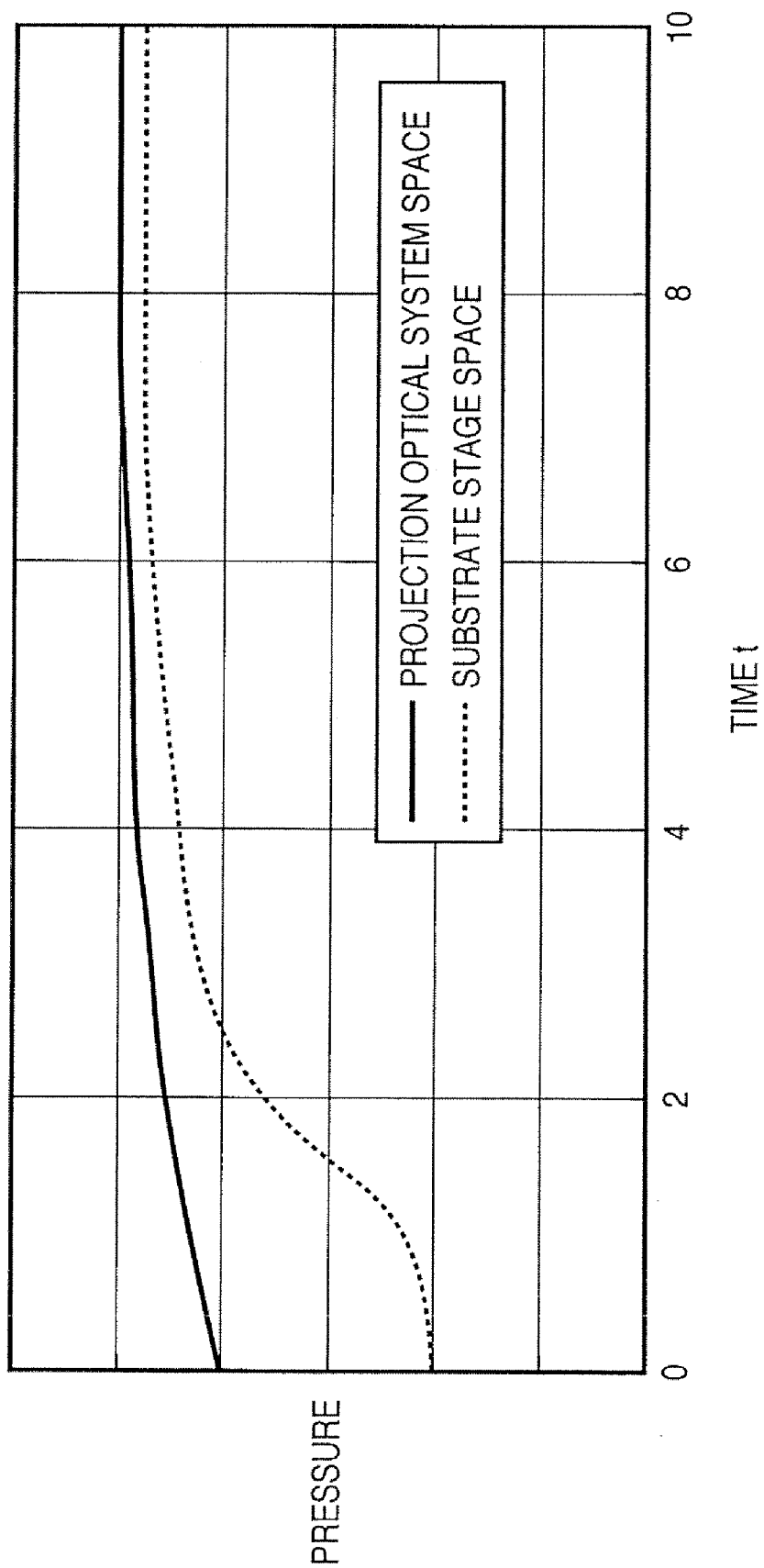
FIG. 2 is a graph showing pressure control (pressure control 2) according to the preferred embodiment of the present invention.

When supplying high-purity gas to the projection optical system space 28 to inhibit a contaminant from mixing from the substrate stage space 26, the pressure controller 100 performs pressure control shown in, e.g., FIG. 2. More specifically, the pressure controller 100 pressurizes the projection optical system space 28 and substrate stage space 26 to an atmospheric pressure while maintaining a relationship in which the pressure in the former is higher than that in the latter (pressurization procedure).

Figure 4:
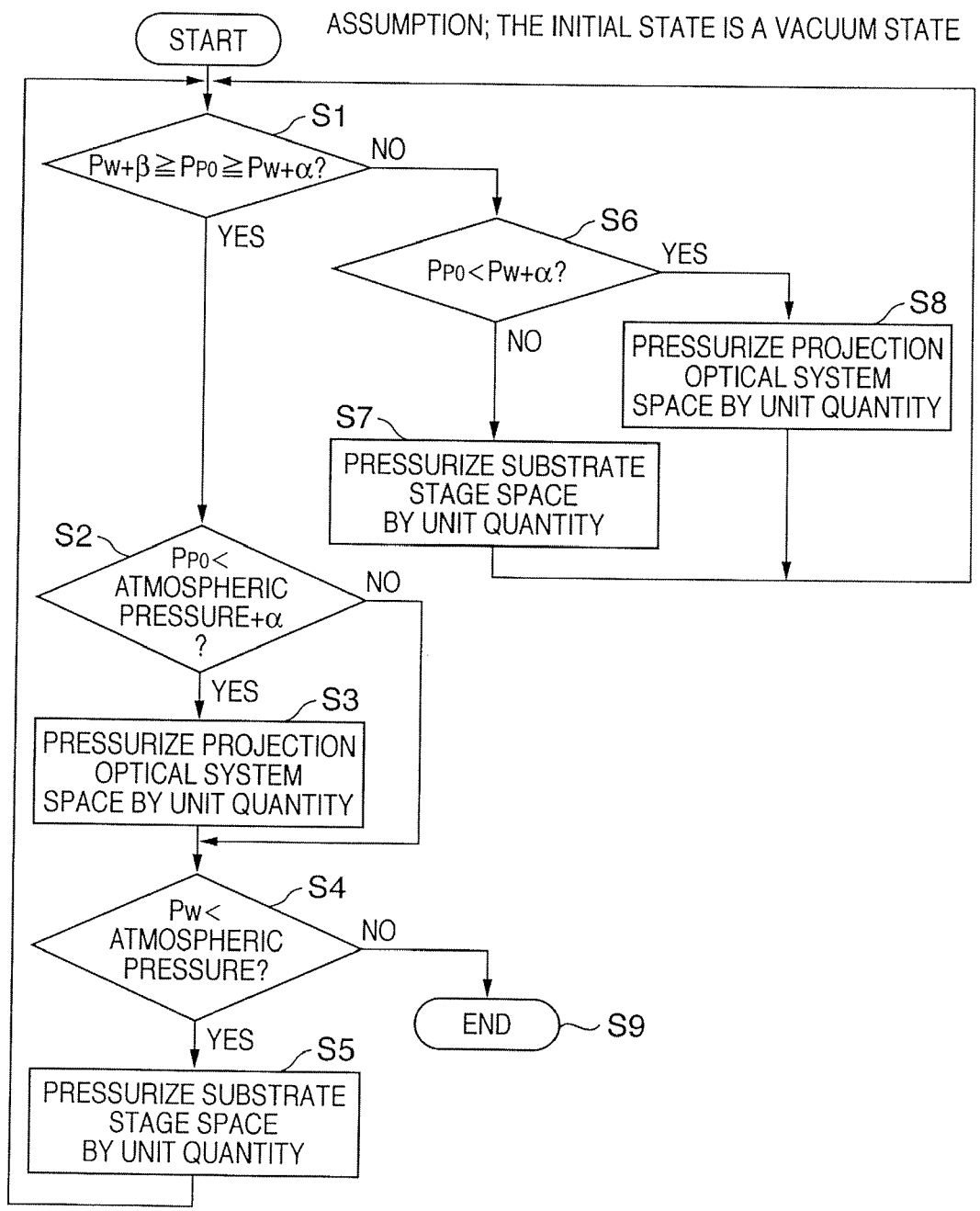
FIG. 4 is a flowchart of pressure control in the preferred embodiment of the present invention.

FIG. 4 is a flowchart showing the procedure of pressure control by the pressure controller 100. By following this procedure, <pressure control 1> and <pressure control 2> described above are performed. Note that in FIG. 4, an exposable vacuum state is set as the initial state.

Reference symbols in FIG. 4 have the following meanings.

$P_W$: pressure in the substrate stage space 26

$P_{P0}$: pressure in the projection optical system space 28

α: pressure margin against inflow of the foreign substance

β: pressure margin against the partition strength

α (pressure margin against inflow of the foreign substance) is a pressure margin for a pressure difference to prevent diffusion of the outgas from the substrate stage space 26 to the projection optical system space 28. In the high vacuum, collision of molecules is very rare. Hence, a method of preventing inflow by providing a differential pressure, as with an ordinary gas or fluid, cannot be employed.

The Knudsen number (Kn) defines the rarefaction degree of a gas as Kn=λ/L where λ is the mean free path of gas molecules, and L is the typical length of the flow field. If Kn exceeds 0.01 (Kn>0.01), the gas forms a rare gas and cannot be regarded as a continuous flow. Then, it is difficult to prevent outgas inflow by providing a differential pressure.

α can be approximately 10 Pa when the pressures $P_W$ and $P_{P0}$ are approximately atmospheric pressures, and can be a value (pressure difference) that decreases as the pressures $P_W$ and $P_{P0}$ decrease.

β (pressure margin against the partition strength) is a safe amount which is preset so the pressure difference between the two spaces 26 and 28 as the targets does not exceed the strength of the partition. The pressures in the two spaces 26 and 38 are controlled so the pressure difference between the spaces does not exceed β. β is a parameter which is set in accordance with the strength of the partition as the target, and can be set to, e.g., 100 Pa or less. As the partition is provided with mechanisms such as a bellows which isolates vibration, an opening/closing door for maintenance, a conductance controlling variable opening, and the like, a large pressure difference should not be applied to the partition. A larger pressure margin β may be set if the partition and a component attached to it have sufficiently high strengths.

In step 1, the pressure controller 100 measures the pressure $P_{P0}$ in the projection optical system space 28 and the pressure $P_W$ in the substrate stage space 26 by using the pressure sensors 50 and 52, respectively. In step 1 the pressure controller 100 also checks whether $P_W+β≧P_{P0}≧P_W+α$ holds. Whether or not $P_W+β≧P_{P0}$ holds signifies whether or not the pressure difference between the two spaces falls within the pressure margin β against the strength of the partition 25. Whether or not $P_{P0}≧P_W+α$ holds signifies whether or not the pressure $P_{P0}$ in the projection optical system space 28 is equal to or higher than the pressure margin α against the inflow of the foreign substance and higher than the pressure $P_W$ in the substrate stage space 26. If $P_W+β≧P_{P0}≧P_W+α$ holds, the process advances to step 2. If No, the process advances to step 6.

In step 2, the pressure controller 100 checks whether or not the pressure $P_{P0}$ in the projection optical system space 28 measured in step 1 reaches the atmospheric pressure. Even after vacuum break, the projection optical system space 28 requires pressurizing, because a foreign substance may flow into it. Hence, in step 2, desirably, whether or not the projection optical system space 28 is lower than the atmospheric pressure is checked based on a pressure obtained by adding α to the atmospheric pressure as the checking criterion. If Yes, the process advances to step 3. If No, the process advances to step 4.

In step 3, the pressure controller 100 opens the gas supply valve 45 (first pressure regulator) and supplies high-purity helium to the projection optical system space 28 to pressurize it by a unit quantity.

In step 4, the pressure controller 100 checks whether or not the pressure $P_W$ in the substrate stage space 26 measured in step 1 is lower than the atmospheric pressure. If Yes, the process advances to step 5. If No, the process advances to step 9 to end the series of pressure control.

In step 5, the pressure controller 100 opens the gas supply valve 47 (second pressure regulator) and supplies nitrogen gas to the substrate stage space 26 to pressurize it by a unit quantity. Note that if the outgas may flow and diffuse in the substrate stage space 26 and α need be set sufficiently large, step 5 can be omitted. In this case, high-purity helium gas supplied to the projection optical system space 28 flows into and diffuses in the substrate stage space 26 through the opening 27. Thus, $P_W$ satisfies the checking condition of step 4 as time elapses.

In step 6, the pressure controller 100 checks whether or not $P_{P0} < P_W + \alpha$ holds. If Yes, it signifies that $P_{P0} \geq P_W + \alpha$ did not hold in step 1. Conversely, if No, it signifies that $P_{P0} \geq P_W + \alpha$ held in step 1, that is, $P_W + \beta \geq P_{P0}$ did not hold in step 1. If Yes in step 6, the process advances to step 8. If No in step 6, the process advances to step 7.

In step 7, the pressure controller 100 opens the gas supply valve 47 (second pressure regulator) and supplies nitrogen gas to the substrate stage space 26 to pressurize it by a unit quantity.

In step 8, the pressure controller 100 opens the gas supply valve 45 (first pressure regulator) and supplies high-purity helium to the projection optical system space 28 to pressurize it by a unit quantity.

In step 9, the pressure controller 100 ends the series of pressure control concerning vacuum break.

After breaking vacuum while protecting the low outgas space (projection optical system space 28) by the above pressure control, the exposure apparatus must be restored to the vacuum state again. With the pressure control according to the preferred embodiment of the present invention, after vacuum breaking, the pressure in the projection optical system space 28 is maintained higher than that in the substrate stage space 26. Hence, when restoring the exposure apparatus to the vacuum state again, it is evacuated while maintaining the above pressure difference in the same manner as in the above pressure control method to prevent diffusion and inflow of the outgas from the substrate stage space 26 to the projection optical system space 28.

As the pressure control of the projection optical system space 28 and substrate stage space 26, the following pressure control may be possible in accordance with the relationship in pressure between the space 28 and space 26 during exposure after evacuating the exposure apparatus again.

Pressure Control 3

Figure 5:
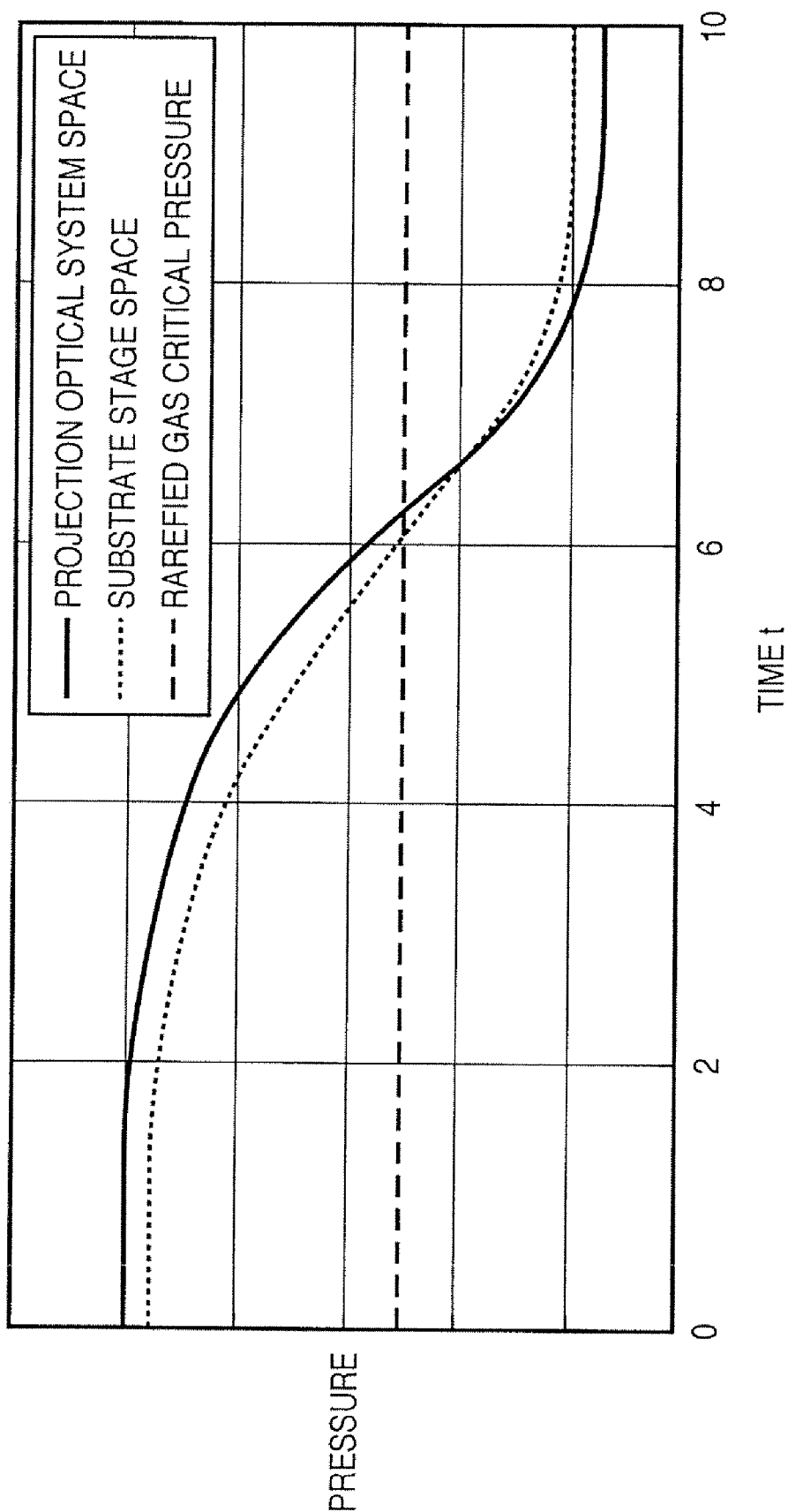
FIG. 5 is a graph showing pressure control (pressure control 3) according to the preferred embodiment of the present invention.

In exposure, when the projection optical system space 28 is maintained at a high vacuum and the substrate stage space 26 is maintained at a low vacuum ((the pressure in the projection optical system space) < (the pressure in the substrate stage space)), the pressure controller 100 performs pressure control shown in, e.g., FIG. 5. Referring to FIG. 5, the "rarefied gas critical pressure" is a pressure in the vicinity of the boundary of an ordinary gas and rarefied gas, with which the Knudsen number Kn is, e.g., Kn=0.01.

After breaking vacuum, high-purity gas is supplied to the projection optical system space 28 by <pressure control 1> to maintain the pressure in the projection optical system space 28 higher than that in the substrate stage space 26. Thus, at the start of evacuation, the pressure in projection optical system space 28 is higher than that in the substrate stage space 26.

First, when the pressure in each of the projection optical system space 28 and substrate stage space 26 is higher than the rarefied gas critical pressure, the pressure controller 100 performs evacuation while maintaining this pressure difference (depressurization procedure). Preferably, pressure control at this time is performed by considering the pressure margin α against the foreign substance inflow and the pressure margin β against the partition strength in the same manner as in the flowchart shown in FIG. 4.

When the pressure in each of the projection optical system space 28 and substrate stage space 26 becomes lower than the rarefied gas critical pressure, depending on the pressure difference, the pressure controller 100 cannot prevent the foreign substance inflow to the projection optical system space 28. Thus, when the pressure in each of the projection optical system space 28 and substrate stage space 26 becomes lower than the rarefied gas critical pressure, the pressure controller 100 quickly changes the pressures in the two spaces 28 and 26 to their target pressures (additional depressurization procedure). Then, the relationship in pressure between the projection optical system space 28 and substrate stage space 26 reverses to maintain the projection optical system space 28 at a high vacuum.

Pressure Control 4

Figure 6:
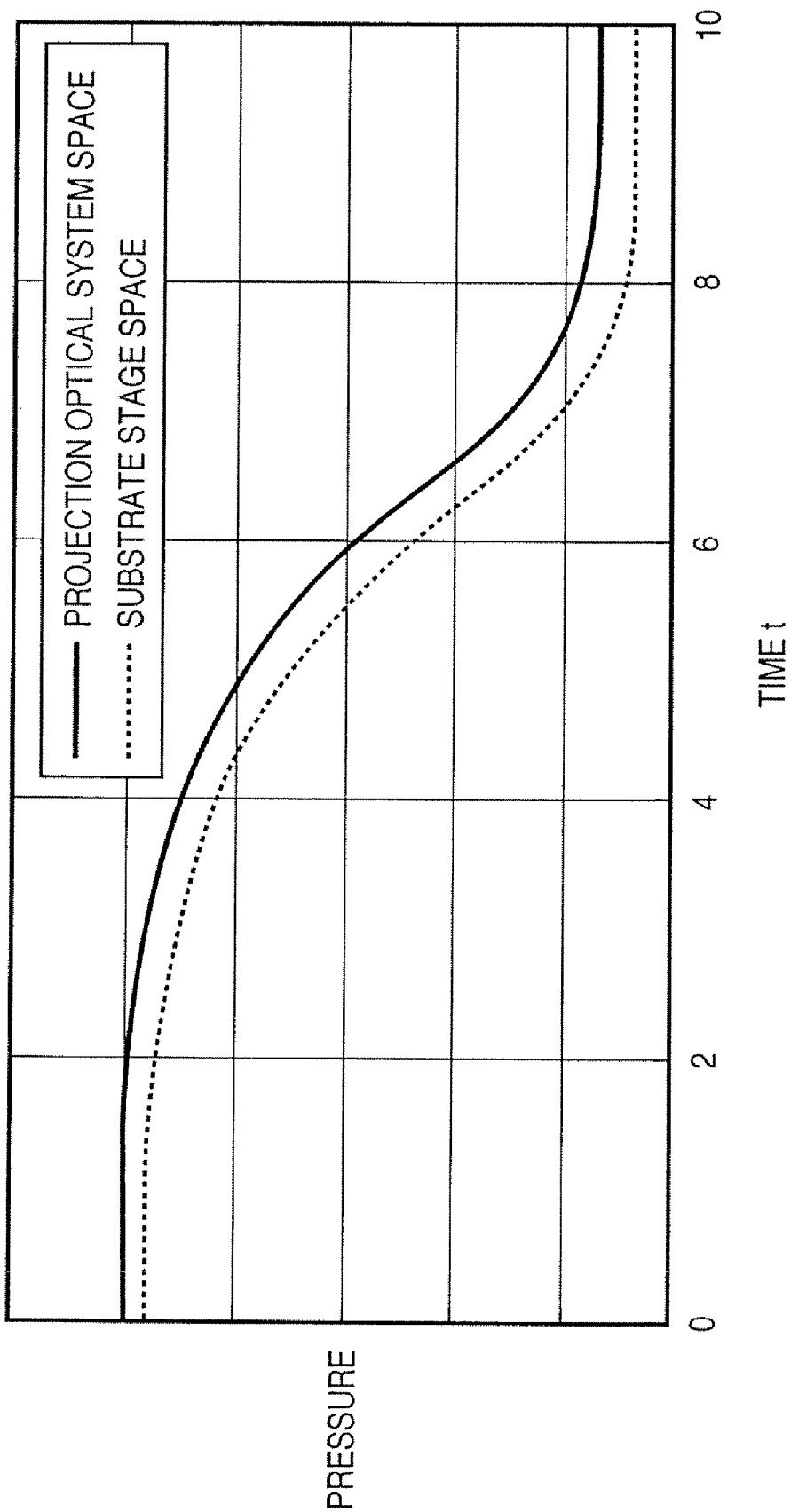
FIG. 6 is a graph showing pressure control (pressure control 4) according to the preferred embodiment of the present invention.

In exposure, when supplying a high-purity gas to the projection optical system space 28 to inhibit a contaminant from mixing from the substrate stage space 26, the pressure controller 100 performs pressure control shown in, e.g., FIG. 6.

After breaking vacuum, as the high-purity gas is introduced to the projection optical system space 28 to maintain it at a pressure higher than that in the substrate stage space 26, at the start of evacuation, the projection optical system space 28 is at a pressure higher than that in the substrate stage space 26. Hence, pressure control is performed to evacuate while maintaining this pressure difference (depressurization procedure).

Figure 7:
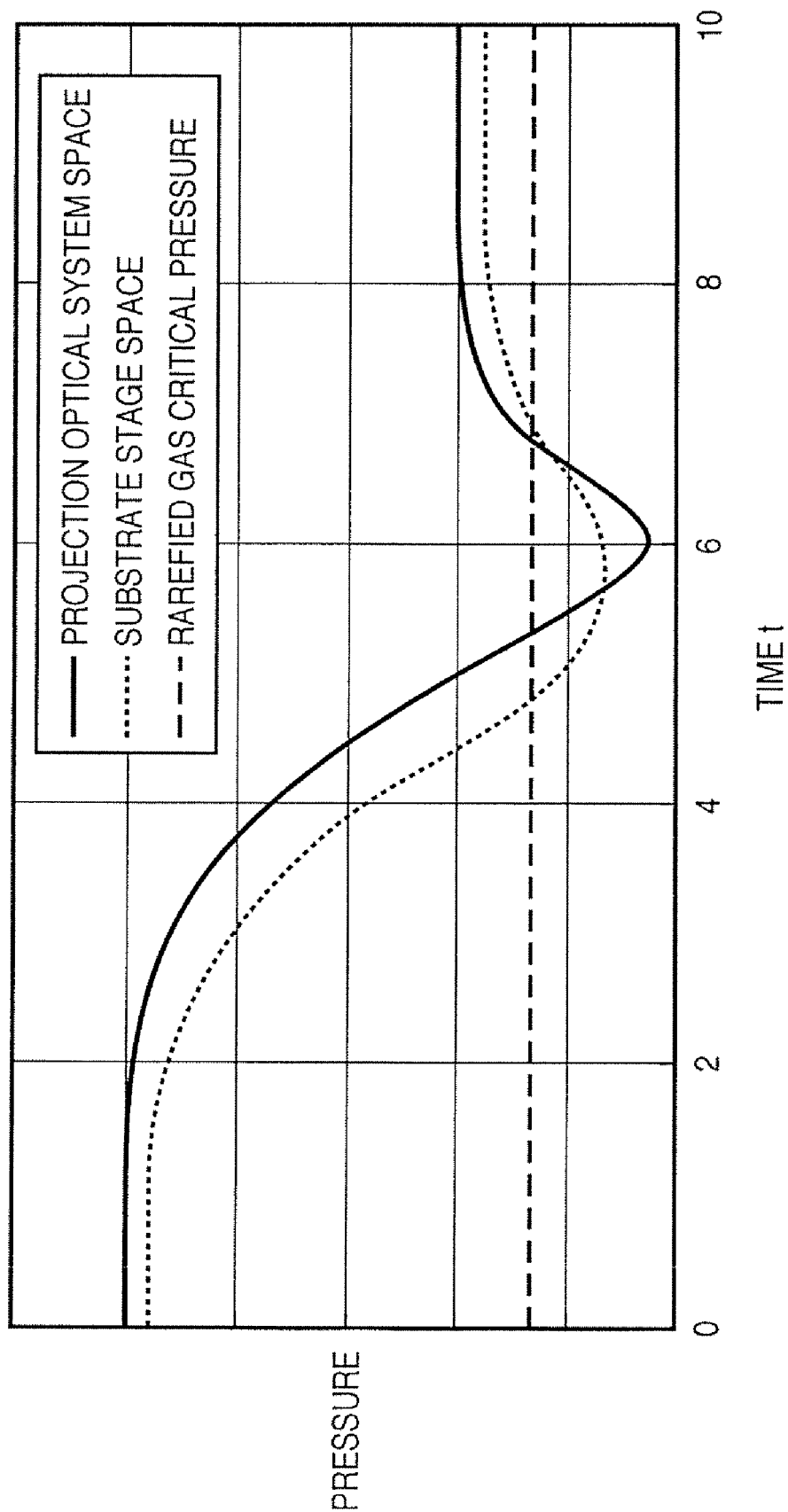
FIG. 7 is a graph showing pressure control (a modification of pressure control 4) according to the preferred embodiment of the present invention.

To decrease the outgas in the spaces 28 and 26, the spaces 28 and 26 may be evacuated to target vacuum degrees. In this case, pressure control as shown in FIG. 7 is desirably performed. In the pressure control shown in FIG. 7, evacuation is performed while maintaining the pressure difference until the pressure in each of the projection optical system space 28 and substrate stage space 26 becomes lower than the rarefied gas critical pressure. When the pressure in each of the projection optical system space 28 and substrate stage space 26 becomes lower than the rarefied gas critical pressure, the projection optical system space 28 and substrate stage space 26 are quickly evacuated to the target vacuum degrees. During this evacuation, in FIG. 7, the pressure in the substrate stage space 26 is higher than that in the projection optical system space 28. This is because the substrate stage space 26 has more factors that generate the outgas. This depends on the arrangement of the gas exhaust system 42 for the projection optical system space 28 and the arrangement of gas exhaust system 43 for the substrate stage space 26.

After evacuating the spaces 28 and 26 to the target vacuum degrees, high-purity gas is introduced to the projection optical system space 28 to pressurize it to a target pressure so inflow and diffusion of the outgas from the substrate stage space 26 will occur.

The pressure control described as <pressure control 4> is also preferably performed by considering the pressure margin α against the foreign substance inflow and the pressure margin β against the partition strength. Although the above <pressure control 1> to <pressure control 4> are typically exemplified concerning, e.g., the projection optical system space 28 and substrate stage space 26 as the target, the following applications are also possible.

Application 1

Figure 8:
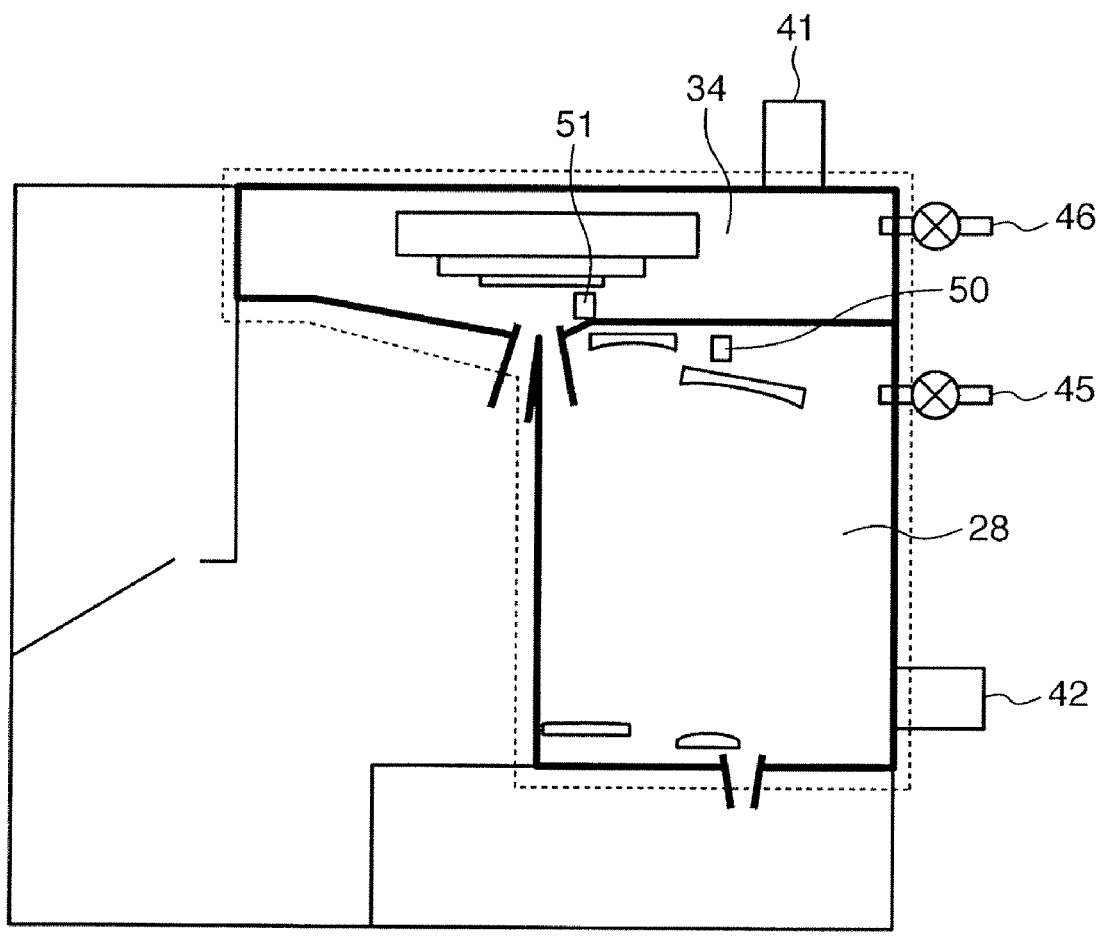
FIG. 8 is a view showing some constituent components extracted from FIG. 14.

As shown in FIG. 8, considering the projection optical system space 28 and reticle stage space 34 as the control target, the pressure control for the substrate stage space 26 in the above embodiment is performed for the reticle stage space 34.

Application 2

Figure 9:
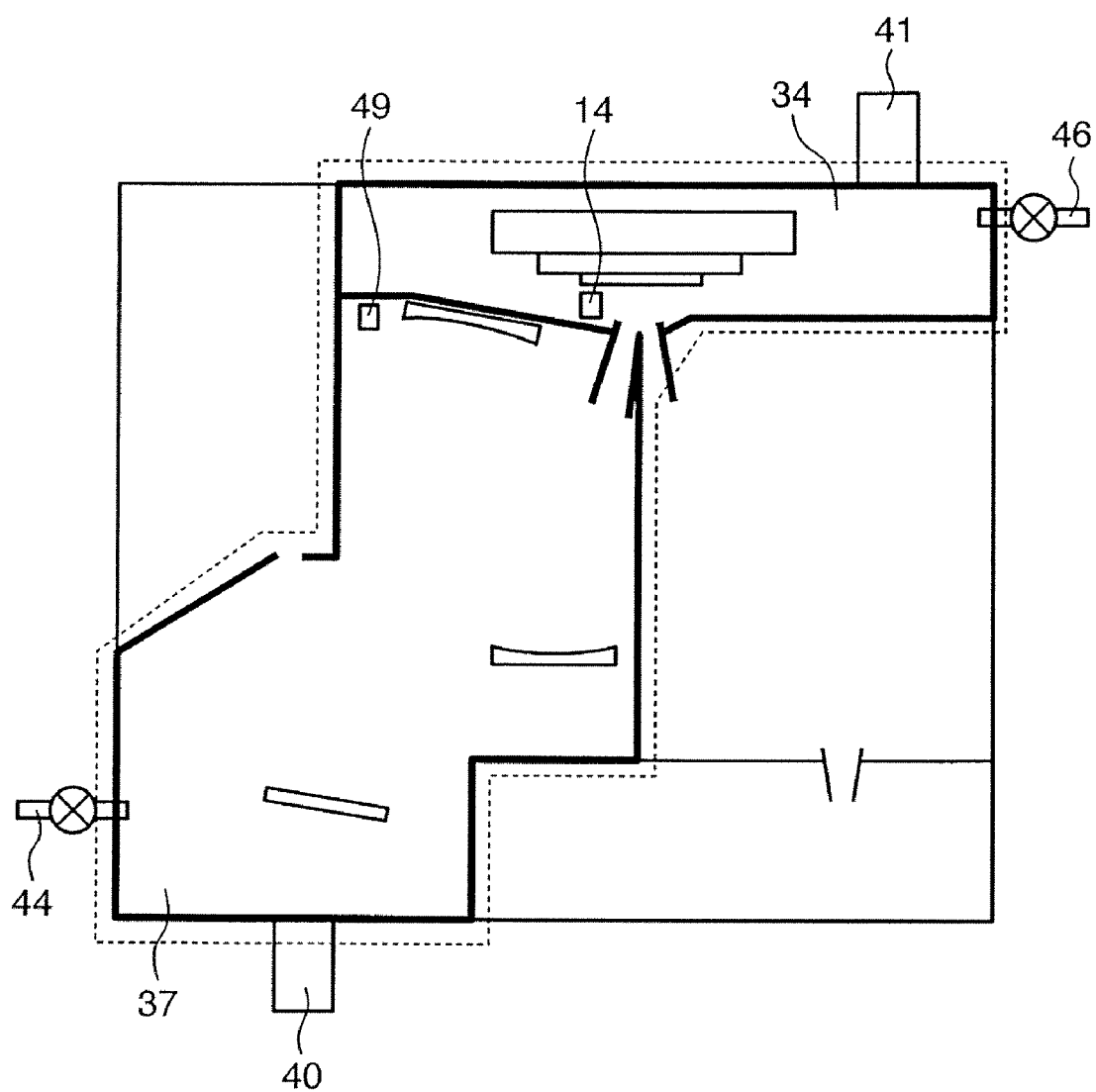
FIG. 9 is a view showing some constituent components extracted from FIG. 14.

As shown in FIG. 9, the reticle stage space 34 and illumination optical system space 37 are the control target. The pressure control for the substrate stage space 26 in the above embodiment is performed for the reticle stage space 34, and the pressure control for the projection optical system space 28 is performed for the opening 27.

Application 3

As shown in FIG. 10, the illumination optical system space 37 and projection optical system space 28 are the control target. The pressure control for the substrate stage space 26 in the above embodiment is performed for the light source space 38, and the pressure control for the projection optical system space 28 is performed for the illumination optical system space 37.

Application 4

Figure 11:
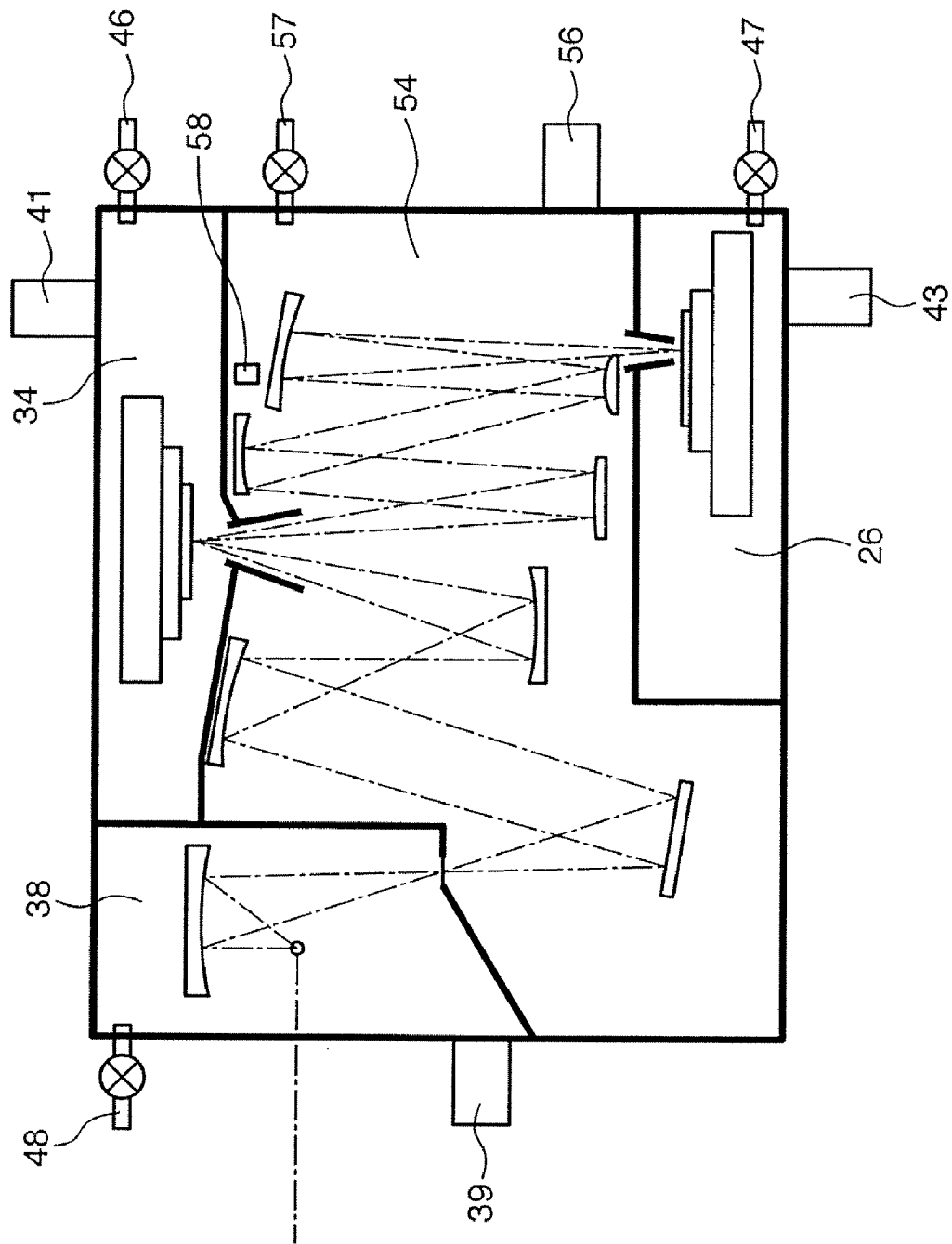
FIG. 11 is a view showing spaces (optical system space—substrate stage space) as a pressure control target in an embodiment of the present invention.

As shown in FIG. 11, the partition 30 between the illumination optical system space 37 and projection optical system space 28 is removed to form one optical system space 54. The pressure control for the projection optical system space 28 in the above embodiment is performed for the optical system space 54.

Application 5

The pressure control for the substrate stage space 26 in application 4 is performed for the reticle stage space 34.

Application 6

The pressure control for the substrate stage space 26 in application 4 is performed for the light source space 38, and the pressure control for the projection optical system space 28 is performed for the optical system space 54.

Application 7

Figure 12:
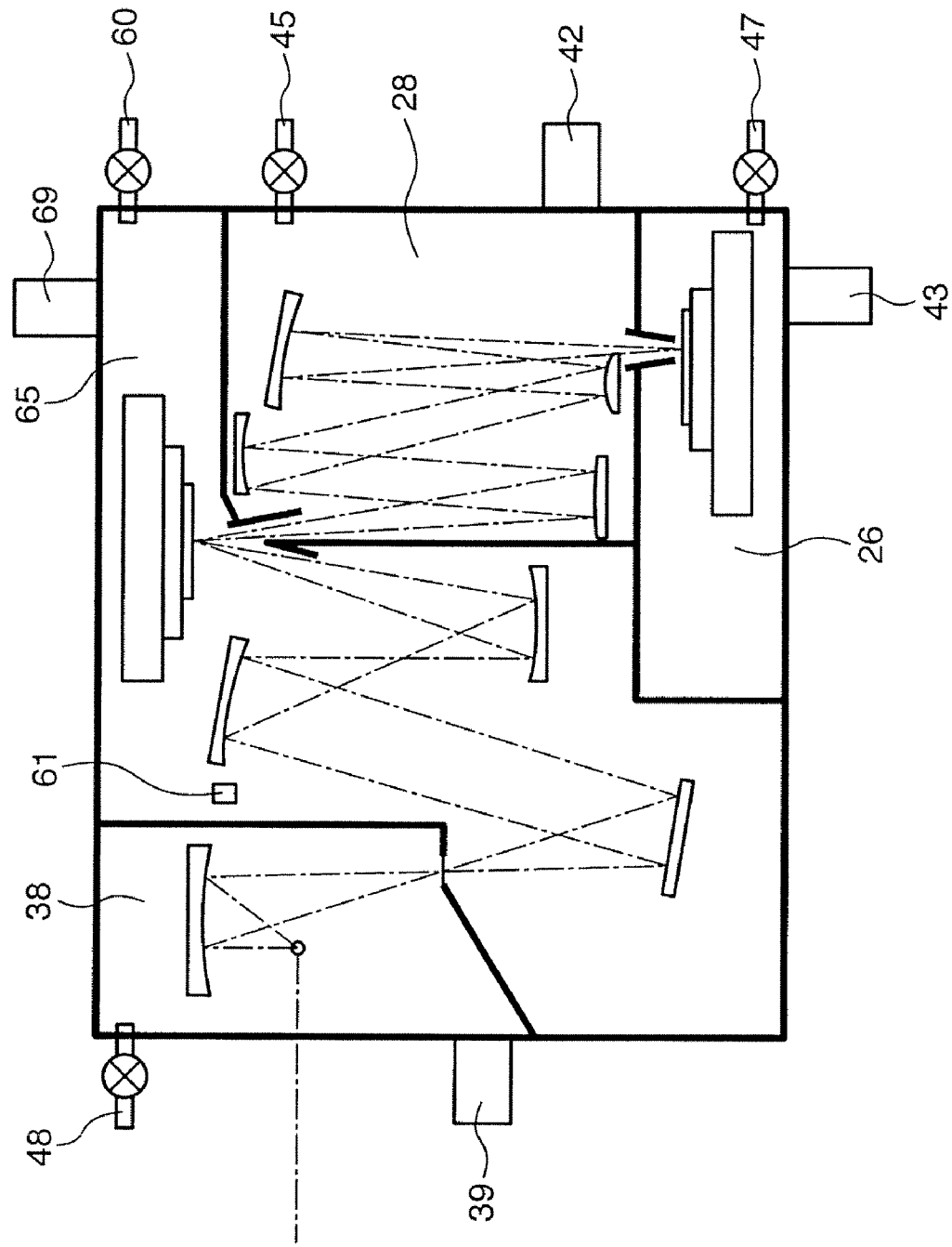
FIG. 12 is a view showing spaces (projection optical system space—reticle illumination optical system space) as a pressure control target in the embodiment of the present invention.
Figure 13:
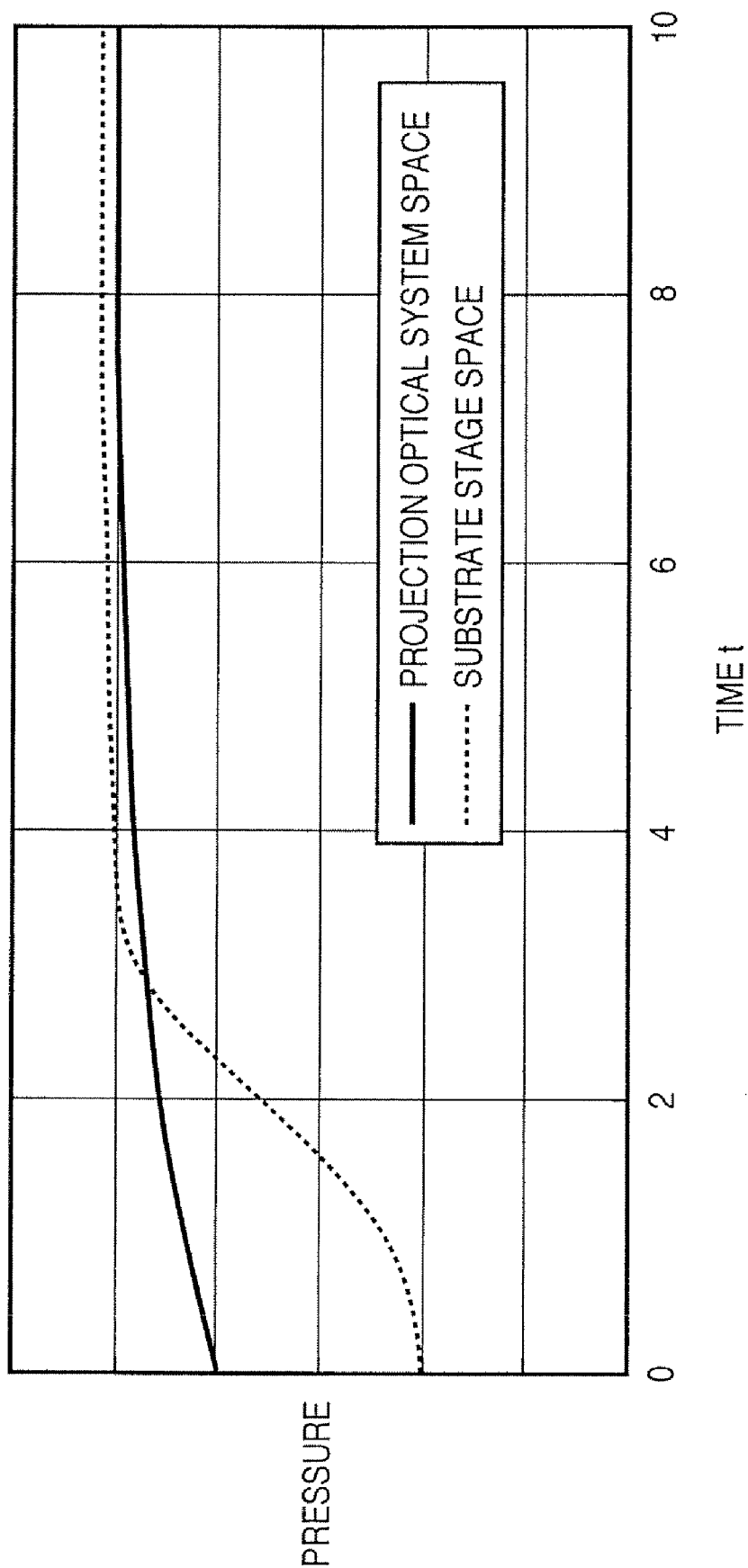
FIG. 13 is a graph to explain the problem of inflow and diffusion of outgas in breaking vacuum.

As shown in FIG. 12, the partition 33 between the illumination optical system space 37 and reticle stage space 34 is removed to form one reticle illumination optical system space 65. The pressure control for the wafer stage space 26 in the above embodiment is performed for the reticle illumination optical system space 65.

Application 8

In the above application 7, the pressure control for the wafer stage space 26 is performed for the light source space 38, and the pressure control for the projection optical system space 28 is performed for the reticle illumination optical system space 65.

Furthermore, a gate valve can be provided to close the window 36 between the light source space 38 and illumination optical system space 37. This allows vacuum break of only the light source space 38.

The above embodiment and applications can be applied to pressure control of three or more spaces. For example, considering the substrate stage space 26, projection optical system space 28, and reticle stage space 34 as the control target, pressure control can be performed in a manner similar to that in the flowchart of FIG. 4. For example, the pressure control for the substrate stage space 26 can be applied to the pressure control of the reticle stage space 34 containing a large amount of outgas, in the same manner as the substrate stage space 26. In this case, the "substrate stage space" in FIG. 4 may be replaced by "the substrate stage space and reticle stage space".

Regarding such pressure control, a pressure difference may be provided between the substrate stage space 26 and reticle stage space 34. In this case, a pressure difference may be provided between the substrate stage space 26 and reticle stage space 34 while applying the pressure control for the substrate stage space 26 described in the flowchart of FIG. 4 to both the stage spaces 26 and 34.

Such pressure control in three or more spaces may be modified in the following manner.

Modification 1

The pressure control for the substrate stage space 26 and that for the reticle stage space 34 are interchanged.

Modification 2

The pressure control for the substrate stage space 26 is performed for the light source space 38, and that for the projection optical system space 28 is performed for the illumination optical system space 37.

Modification 3

The pressure control for the projection optical system space 28 is performed for the optical system space 54.

Modification 4

The pressure control for the projection optical system space 28 is performed for the optical system space 54, and that for the reticle stage space 34 is performed for the light source space 38.

Modification 5

The pressure control for the substrate stage space 26 is performed for the reticle stage space 34, that for the projection optical system space 28 is performed for the optical system space 54, and that for the reticle stage space 34 is performed for the light source space 38.

Modification 6

The pressure control for the reticle stage space 34 is performed for the reticle illumination optical system space 65.

Modification 7

The pressure control for the substrate stage space 26 is performed for the light source space 38, and that for the reticle stage space 34 is performed for the reticle illumination optical system space 65.

APPLICATION TO DEVICE MANUFACTURING METHOD

Figure 15:
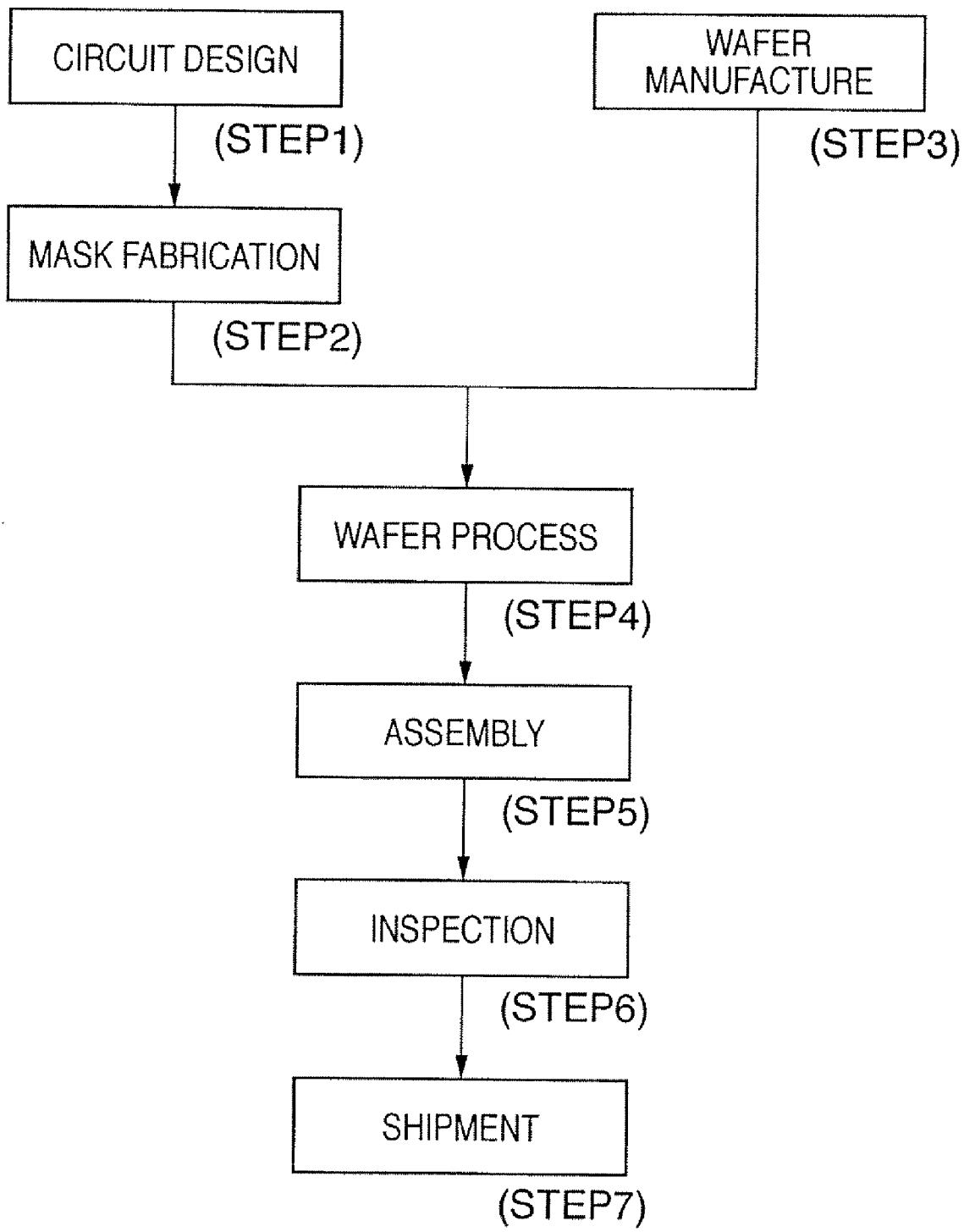
FIG. 15 is a flowchart showing a device manufacturing method according to another preferred embodiment of the present invention.

A semiconductor device manufacturing device which utilizes the above exposure apparatus will be described. FIG. 15 is a flowchart showing the overall semiconductor device manufacturing process. In step 1 (circuit design), the circuit of a semiconductor device is designed. In step 2 (mask fabrication), a mask is fabricated on the basis of the designed circuit pattern. In step 3 (wafer manufacture), a wafer is manufactured using a material such as silicon. In step 4 (wafer process) called a preprocess, an actual circuit is formed on the wafer by lithography using the above mask and wafer. In the next step 5 (assembly) called a post-process, a semiconductor chip is formed using the wafer fabricated in step 4. This step includes processes such as assembly (dicing and bonding) and packaging (chip encapsulation). In step 6 (inspection), inspections such as operation check test and durability test of the semiconductor device fabricated in step 5 are performed. A semiconductor device is finished with these processes and shipped (step 7).

Figure 16:
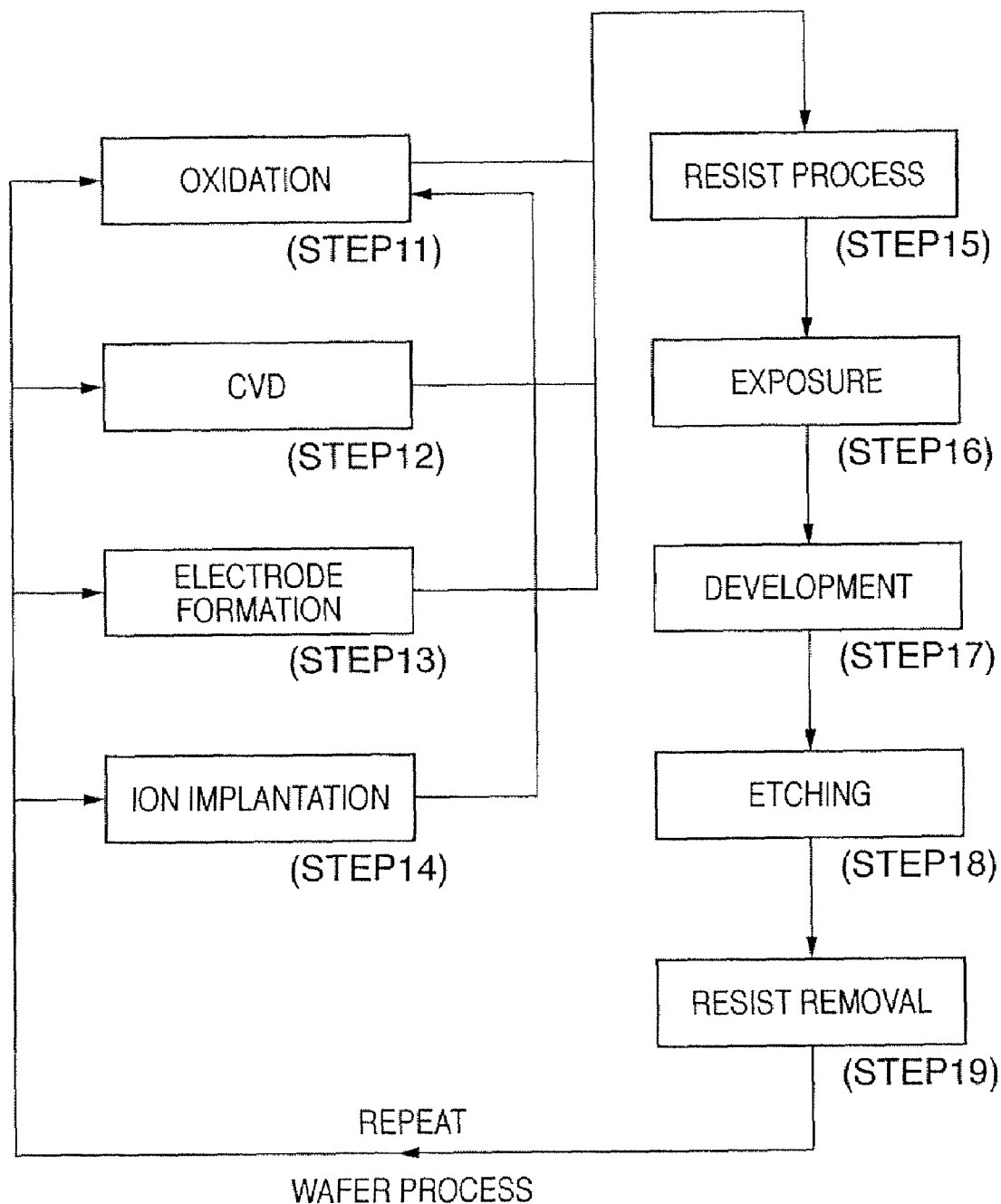
FIG. 16 is a flowchart showing the device manufacturing method according to the embodiment of the present invention of FIG. 14.

FIG. 16 is a flowchart showing the above wafer process in detail. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive agent is applied to the wafer. In step 16 (exposure), the above exposure apparatus transfers the circuit pattern onto the photosensitive agent applied to the wafer to form a latent pattern. In step 17 (development), the latent image transferred onto the wafer is developed to form a resist pattern. In step 18 (etching), portions other than the developed resist image are etched. In step 19 (resist removal), any unnecessary resist remaining after etching is removed. By repeating these steps, multilayered circuit patterns are formed on the wafer.

When applying the present invention to an exposure apparatus such as an EUV exposure apparatus in which two spaces having different vacuum degrees and outgas amounts are present and a partition having an opening connects the two spaces, the following effects are obtained.

When breaking vacuum of the exposure apparatus, by maintaining a relationship in which the pressure in the first space, which is maintained at a high vacuum and has a small outgas amount, is higher than that in the second space which has a large outgas amount, diffusion of the outgas to the first space can be prevented. This can decrease downtime of the exposure apparatus.

After finishing maintenance or the like, by performing pressure control to keep the same pressure relationship and performing evacuation again, diffusion of the outgas to the high-vacuum space can be prevented, and the downtime of the exposure apparatus can be decreased.

When a high-purity gas is supplied to the high-vacuum first space, by performing control in the same manner to make the pressure in the first space to be higher than that in the low-vacuum second space having a large outgas amount, diffusion of the outgas to the high-vacuum space can be prevented. This can decrease downtime of the exposure apparatus.

When a high-purity gas is supplied to the high-vacuum first space, after finishing maintenance or the like, by performing evacuation again to restore the same pressure relationship, diffusion of the outgas to the high-vacuum space can be prevented. This can decrease downtime of the exposure apparatus.

Pressure differences between the respective spaces during vacuum breaking ensure control of the outgas diffusion. This can eliminate an openable/closeable door in the opening of each partition.

Breaking vacuum while controlling the pressure and performing evacuation again with the above method can prevent inflow and diffusion of the outgas to the high-vacuum space. This can decrease attaching of impurities to the optical element placed in the high-vacuum space, and suppress degradation of the optical characteristics.

While the present invention has been described with reference to exemplary embodiments, it is to be understood that the invention is not limited to the disclosed exemplary embodiments. The scope of the following claims is to be accorded the broadcast interpretation so as to encompass all such modifications and equivalent structures and functions.

This application claims the benefit of Japanese Patent Application No. 2006-069901 filed Mar. 14, 2006, which is hereby incorporated by reference herein in its entirety.

What is claimed is:

1. An exposure apparatus which includes an optical system and exposes a substrate in a vacuum atmosphere through said optical system, comprising:

a partition which separates a first space including at least part of said optical system from a second space adjacent to said first space, and includes an opening to pass light therethrough;

a first pressure regulator which regulates a pressure in said first space;

a second pressure regulator which regulates a pressure in said second space; and a controller which outputs manipulated variables for said first pressure regulator and said second pressure regulator, wherein said controller is configured to output the manipulated variables for said first pressure regulator and said second pressure regulator to change the pressure in said first space and the pressure in said second space in a range of a vacuum to an atmospheric pressure while maintaining a pressure relationship in which the pressure in said first space is higher than the pressure in said second space.

2. An exposure apparatus according to claim 1, wherein said controller is configured to increase the pressure in said first space to satisfy the pressure relationship, and thereafter output the manipulated variables for said first pressure regulator and said second pressure regulator to change the pressure in said first space and the pressure in said second space from the vacuum to the atmospheric pressure while maintaining the pressure relationship.

3. An exposure apparatus according to claim 2, wherein said controller is configured to output the manipulated variables for said first pressure regulator and said second pressure regulator to change the pressure in said first space and the pressure in said second space from the atmospheric pressure to the vacuum while maintaining the pressure relationship.

4. An exposure apparatus according to claim 3, wherein said controller is configured to output the manipulated variables for said first pressure regulator and said second pressure regulator, after the pressure in said first space and the pressure in said second space decrease to preset pressures, to satisfy a pressure relationship in which the pressure in said first space is lower than the pressure in said second space.

5. An exposure apparatus according to claim 4, wherein each of the preset pressures comprises a pressure not higher than a rarefied gas critical pressure.

6. An exposure apparatus according to claim 1, wherein each of said first pressure regulator and said second pressure regulator is configured to include a gas exhaust system and a gas supply system.

7. An exposure apparatus according to claim 6, wherein each of said first pressure regulator and said second pressure regulator is configured to further include a pressure sensor.

8. An exposure apparatus according to claim 1, wherein said optical system is configured to include at least one of a projection optical system to project a pattern of an original plate onto the substrate and an illumination optical system to illuminate the original plate.

9. An exposure apparatus according to claim 1, further comprising any one of an original plate stage mechanism which is arranged in said second space to move an original plate, a substrate stage mechanism arranged in said second space to move the substrate, and a light source arranged in said second space.

10. A device manufacturing method comprising:
an exposure step of exposing a substrate in a vacuum atmosphere using an exposure apparatus according to claim 1;
a developing step of developing the exposed substrate; and
a processing step of processing the developed substrate.

11. A pressure control method to be applied to an exposure apparatus which includes an optical system and a partition that separates a first space including at least part of the optical system from a second space adjacent to the first space, and an opening to pass light therethrough, and which exposes a substrate in a vacuum atmosphere through the optical system, comprising:
measuring a pressure in the first space and a pressure in the second space; and
changing the pressure in the first space and the pressure in the second space in a range of a vacuum to an atmospheric pressure on the basis of a measurement while maintaining a pressure relationship in which the pressure in the first space is higher than the pressure in the second space.

12. A pressure control method according to claim 11, comprising increasing the pressure in the first space to satisfy the pressure relationship, and thereafter changing the pressure in the first space and the pressure in the second space from the vacuum to the atmospheric pressure while maintaining the pressure relationship.

13. A pressure control method according to claim 11, comprising changing the pressure in the first space and the pressure in the second space from the atmospheric pressure to the vacuum while maintaining the pressure relationship.

14. A pressure control method according to claim 13, comprising changing the pressure in the first space and the pressure in the second space, after the pressure in the first space and the pressure in the second space decrease to preset pressures, to satisfy a pressure relationship in which the pressure in the first space is lower than the pressure in the second space.

15. A pressure control method according to claim 14, wherein each of the preset pressures comprises a pressure not higher than a rarefied gas critical pressure.

16. A pressure control method according to claim 11, wherein the optical system is configured to include at least one of a projection optical system to project a pattern of an original plate onto the substrate and an illumination optical system to illuminate the original plate.

17. A pressure control method according to claim 11, wherein any one of an original plate stage mechanism to move an original plate, a substrate stage mechanism to move the substrate, and a light source is arranged in the second space.

* * * * *